United States Patent
Kautzsch et al.

(10) Patent No.: US 9,382,111 B2
(45) Date of Patent: Jul. 5, 2016

(54) MICROMECHANICAL SYSTEM AND METHOD FOR MANUFACTURING A MICROMECHANICAL SYSTEM

(71) Applicant: Infineon Technologies Dresden GmbH, Dresden (DE)

(72) Inventors: Thoralf Kautzsch, Dresden (DE); Heiko Froehlich, Radebeul (DE); Mirko Vogt, Dresden (DE); Maik Stegemann, Pesterwitz (DE); Boris Binder, Dresden (DE); Steffen Bieselt, Stadt Wehlen (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 14/696,757

(22) Filed: Apr. 27, 2015

(65) Prior Publication Data
US 2015/0375999 A1 Dec. 31, 2015

Related U.S. Application Data

(63) Continuation-in-part of application No. 14/315,979, filed on Jun. 26, 2014.

(51) Int. Cl.
*H01L 21/00* (2006.01)
*B81C 1/00* (2006.01)
*B81B 7/00* (2006.01)

(52) U.S. Cl.
CPC .......... *B81C 1/00246* (2013.01); *B81B 7/008* (2013.01); *B81B 2201/0264* (2013.01)

(58) Field of Classification Search
CPC . H01L 21/00; H01L 27/11568; H01L 29/792; H01L 29/11568
USPC ...................... 438/48, 52; 257/254
See application file for complete search history.

(56) References Cited

U.S. PATENT DOCUMENTS

2004/0124481 A1* 7/2004 Partridge ............ B81C 1/00476
257/414
2005/0112843 A1* 5/2005 Fischer ............... H01L 21/2007
438/455

(Continued)

OTHER PUBLICATIONS

U.S. Appl. No. 14/315,979, filed Jun. 26, 2014.

(Continued)

*Primary Examiner* — Phuc Dang
(74) *Attorney, Agent, or Firm* — Eschweiler & Associates, LLC

(57) ABSTRACT

A method for manufacturing a micromechanical system is shown. The method comprises the steps of forming in a front end of line (FEOL) process a transistor in a transistor region. After the FEOL process, a protective layer is deposited in the transistor region, wherein the protective layer comprises an isolating material, e.g. an oxide. A structured sacrificial layer is formed at least in a region which is not the transistor region. Furthermore, a functional layer is formed which is at least partially covering the structured sacrificial layer. After the functional layer is formed removing the sacrificial layer in order to create a cavity between the functional layer and a surface, where the sacrificial layer was deposited on. The protective layer protects the transistor from being damaged especially during etching processes in further processing steps in MOL (middle of line) and BEOL (back end of line) processes. Using an oxide for said protective layer is advantageous, since the same oxide may be used as the basis for a metallization process in the BEOL. Therefore, the protective layer may remain over the transistor and does not need to be removed like the sacrificial layer, which is typically used as a protection for the transistor. Therefore, the protective layer becomes part of the oxide coverage, which is applied before the BEOL process.

15 Claims, 21 Drawing Sheets

(56) References Cited

U.S. PATENT DOCUMENTS

| | | | |
|---|---|---|---|
| 2007/0298238 A1* | 12/2007 | Witvrouw | B81C 1/00293 428/304.4 |
| 2011/0209555 A1* | 9/2011 | Ahles | B81B 3/0081 73/727 |
| 2013/0334700 A1* | 12/2013 | Singh | H01L 23/5222 257/774 |
| 2014/0183753 A1* | 7/2014 | Ellis-Monaghan | H01L 21/84 257/774 |
| 2014/0355381 A1* | 12/2014 | Lal | B81B 3/0021 367/87 |

OTHER PUBLICATIONS

Non Final Office Action Dated Oct. 8, 2015 U.S. Appl. No. 14/315,979.

Notice of Allowance Dated Mar. 2, 2016 U.S. Appl. No. 14/315,979.

* cited by examiner

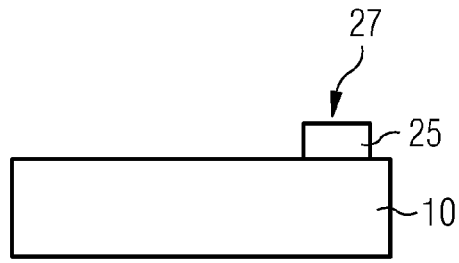
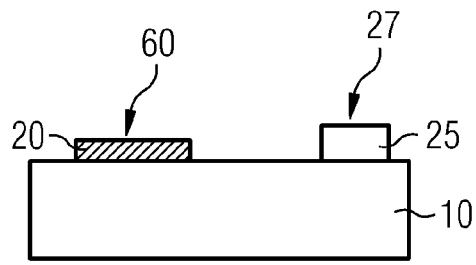
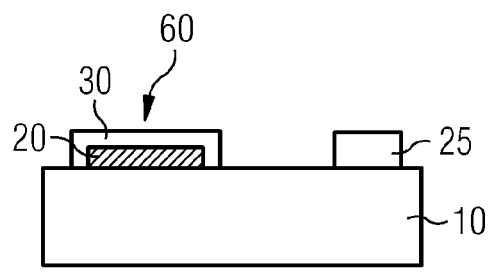
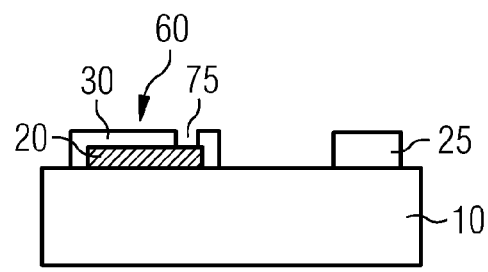
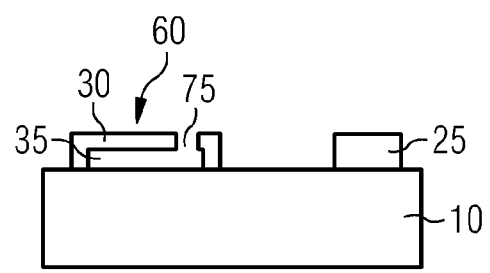
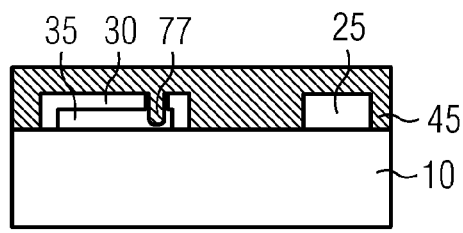
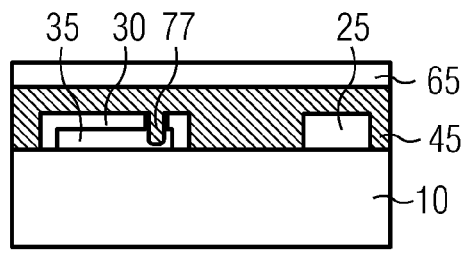

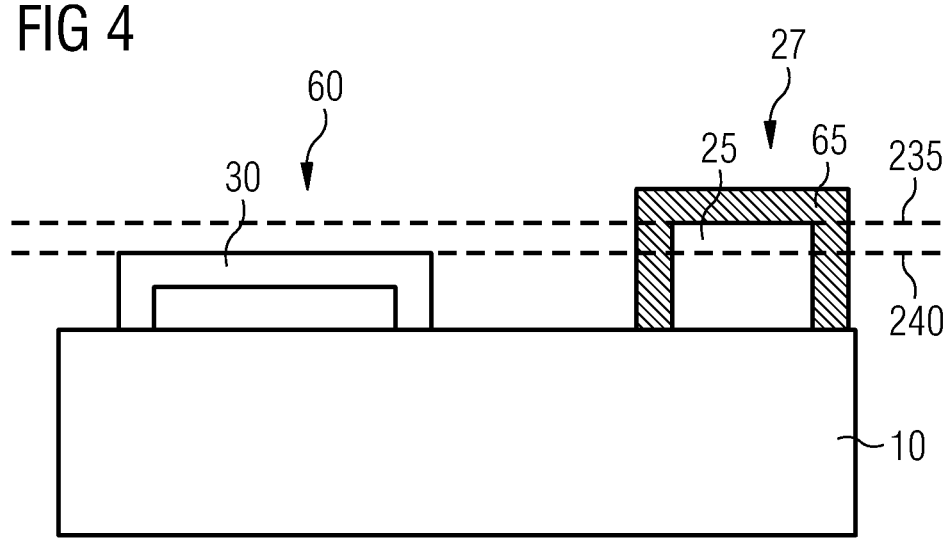

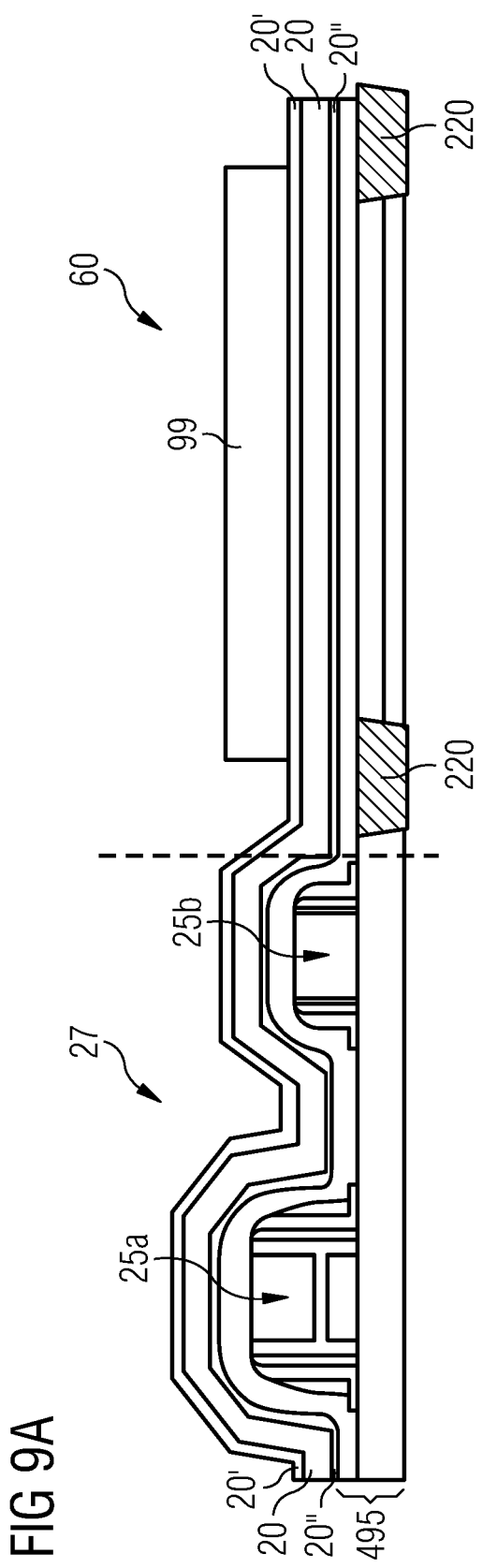

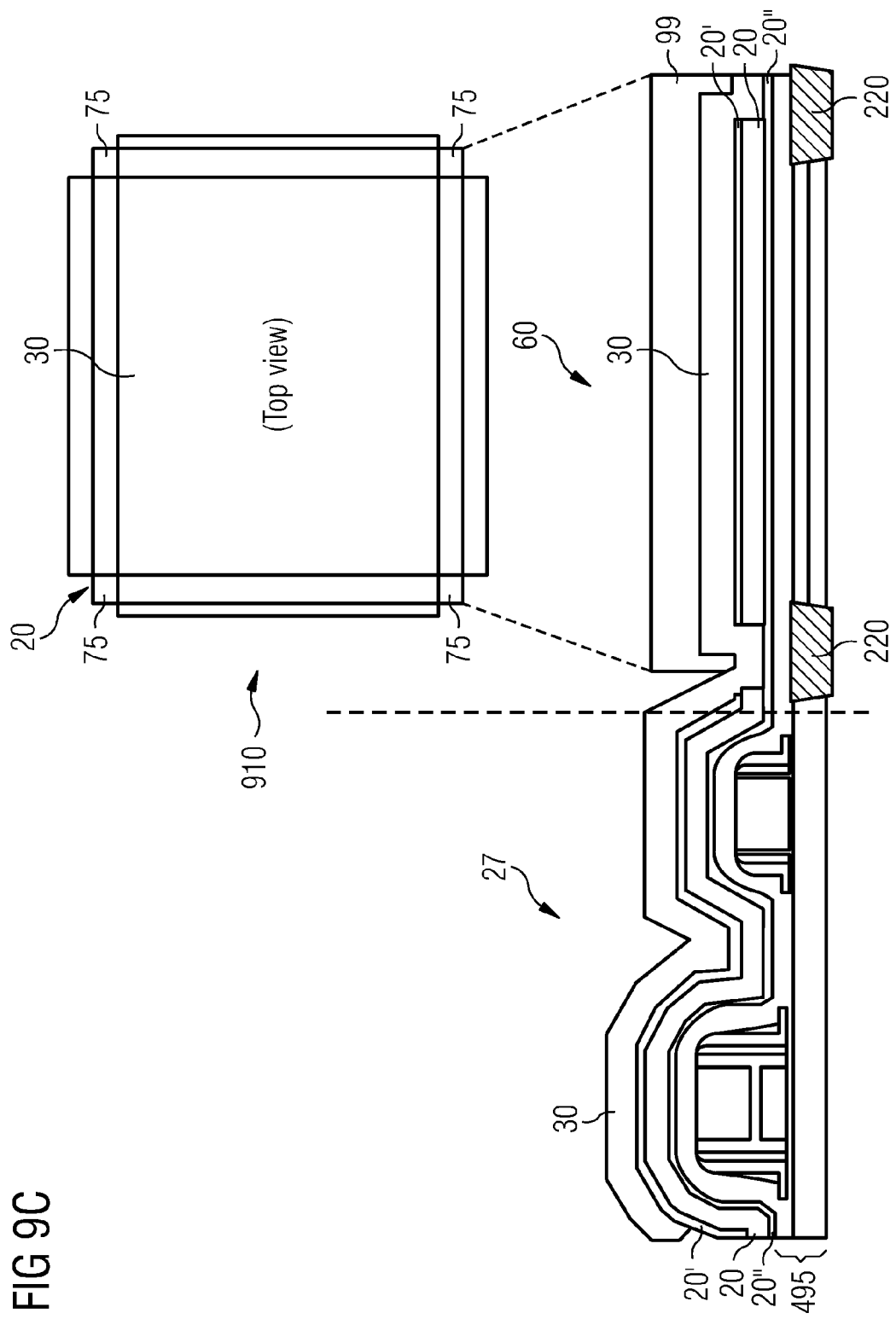

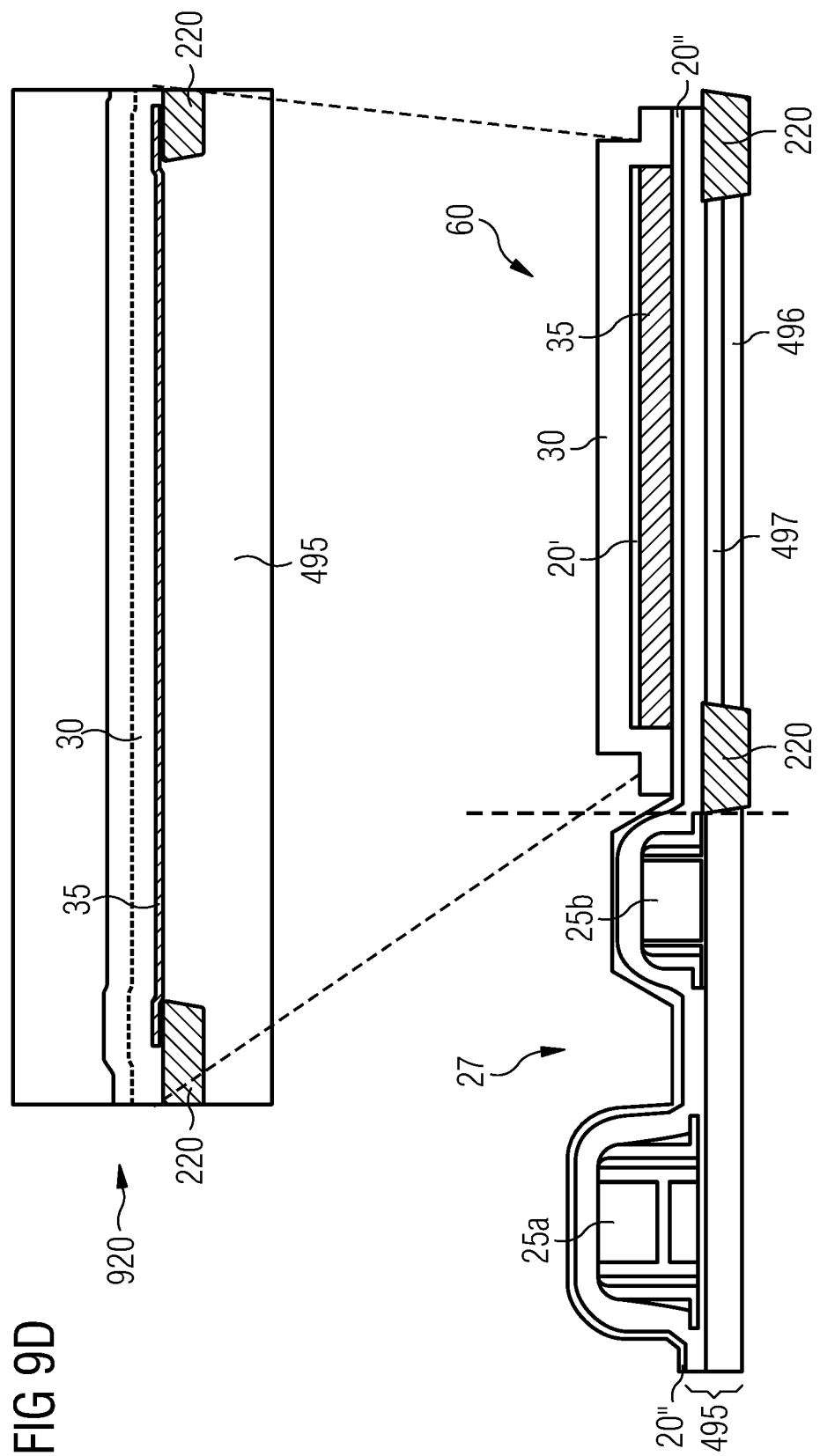

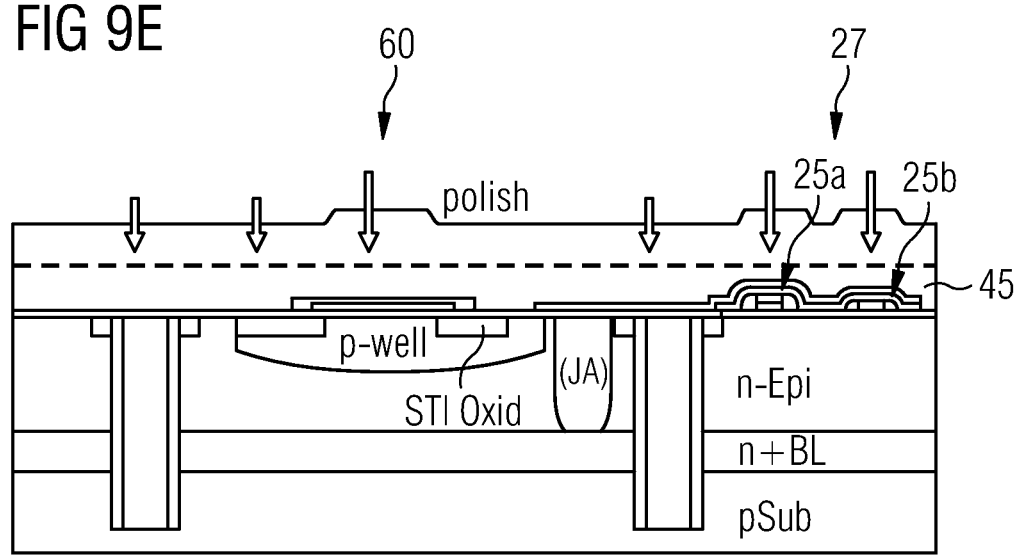

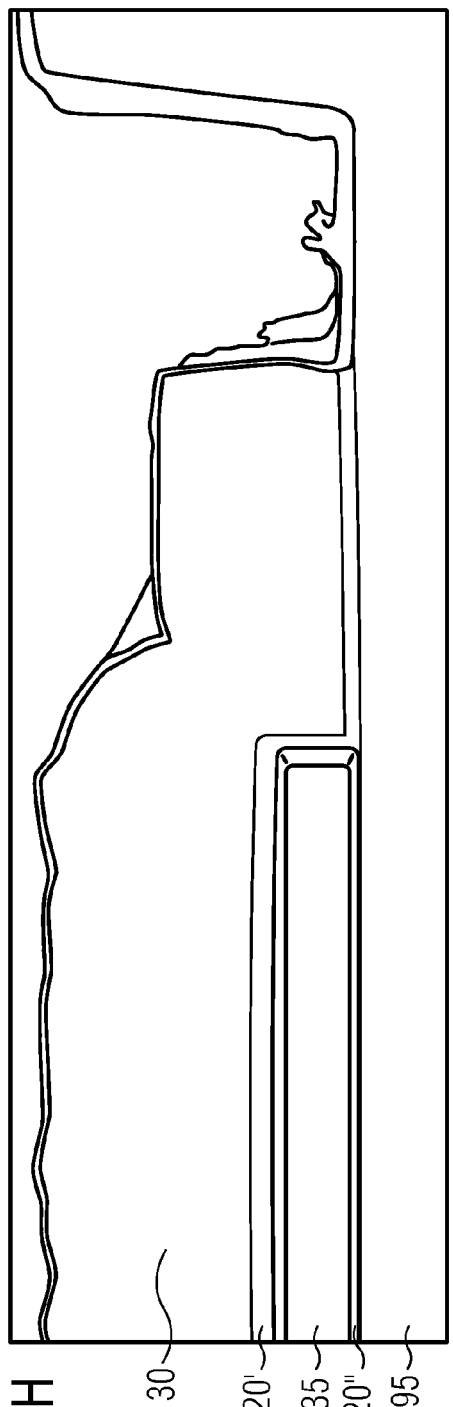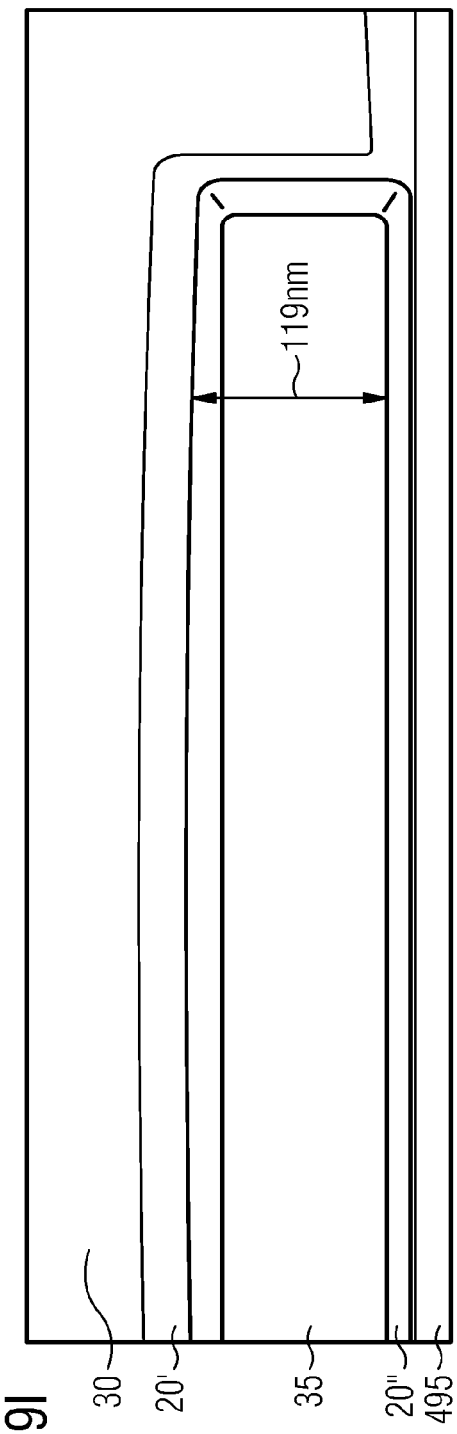

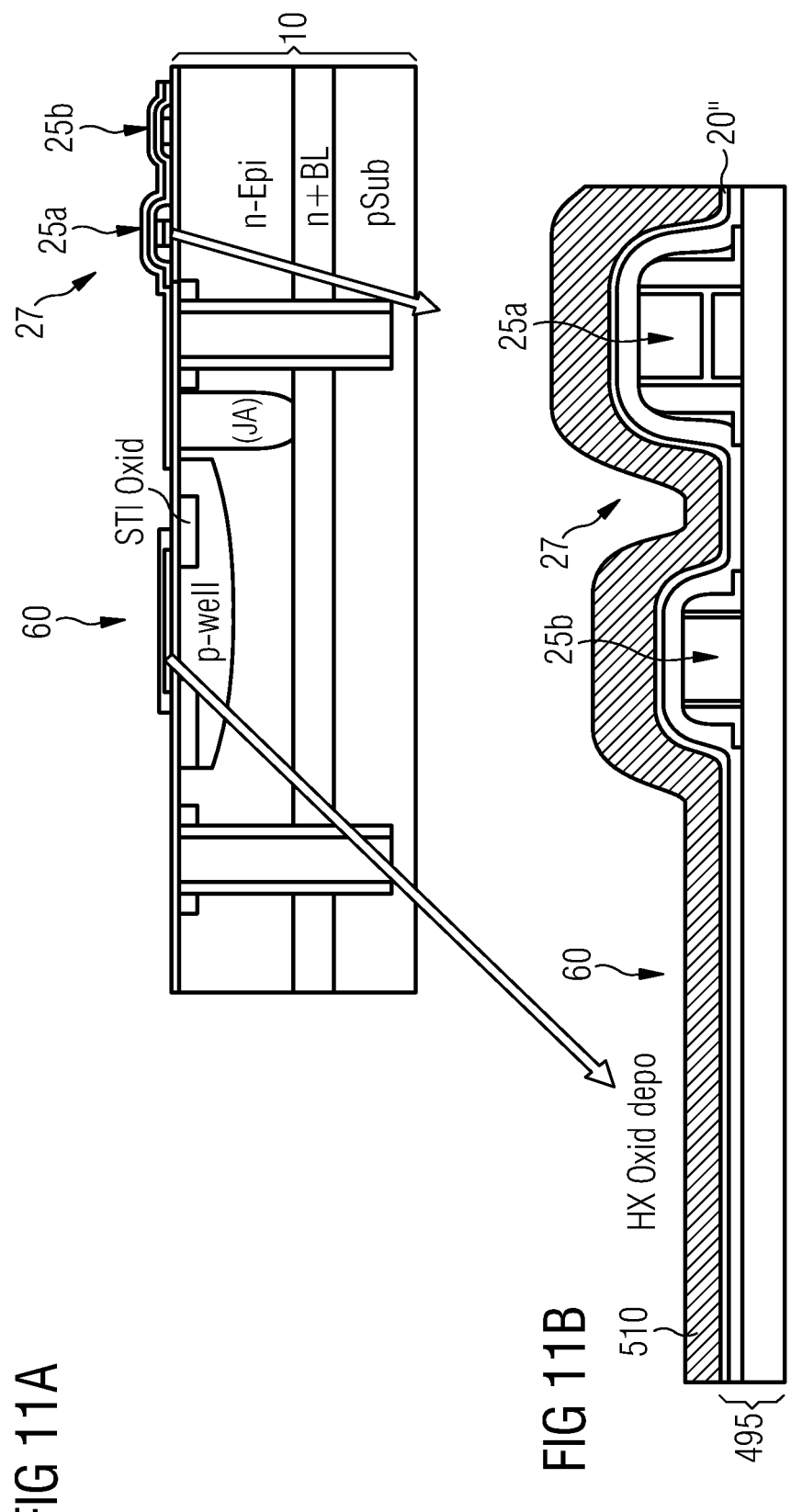

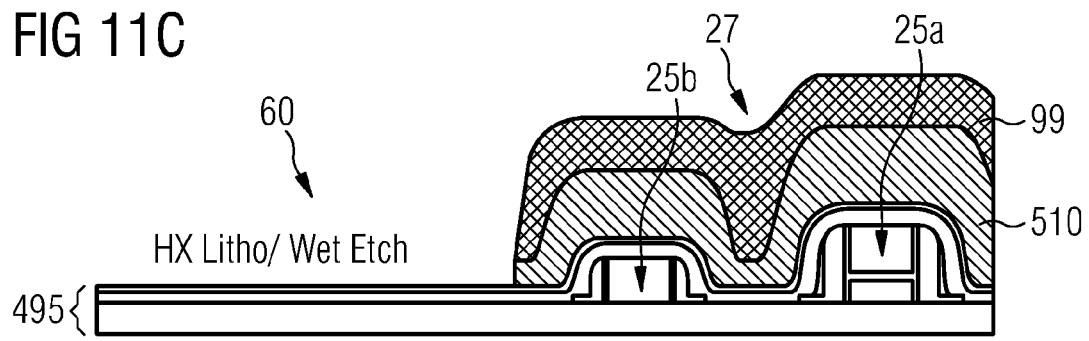
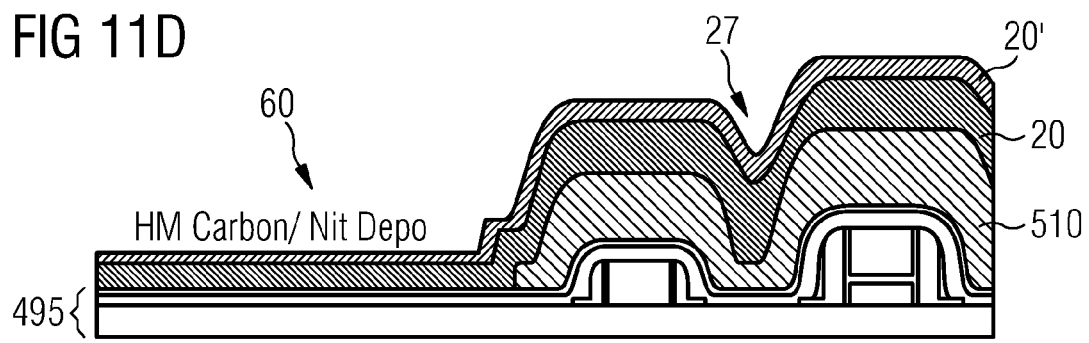
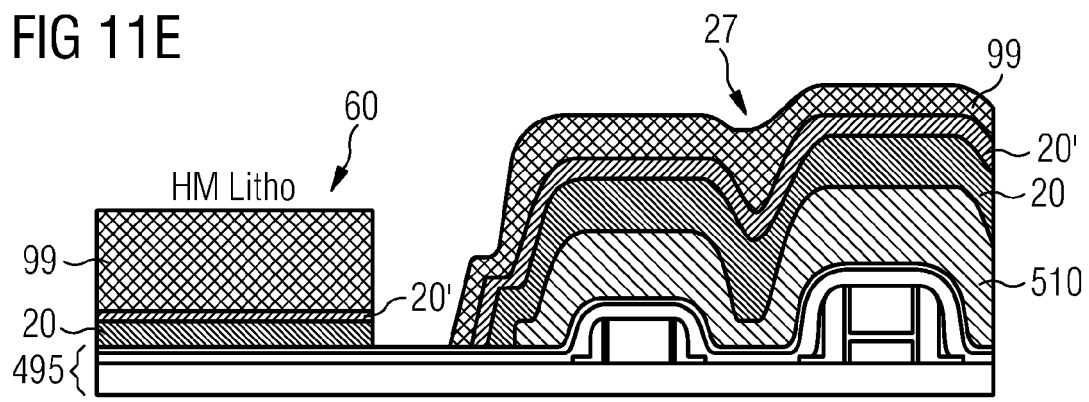
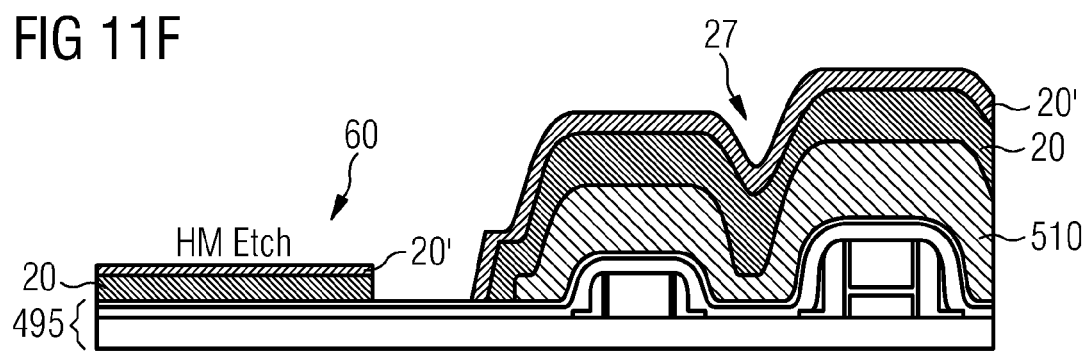

MICROMECHANICAL SYSTEM AND METHOD FOR MANUFACTURING A MICROMECHANICAL SYSTEM

REFERENCE TO RELATED APPLICATION

This application is a continuation-in-part of and claims priority to copending U.S. patent application Ser. No. 14/315,979, filed Jun. 26, 2014, which is incorporated herein by reference in its entirety.

FIELD

Embodiments of the present invention relate to a method for manufacturing a micromechanical system and to the micromechanical system. Further embodiments of the present invention relate to the integration of sensor elements, or more generally MEMS-elements in a CMOS technology.

BACKGROUND

The term microelectromechanical system (MEMS) or micromechanical system is often used to refer to small integrated devices or systems that combine electrical and mechanical components. When focusing on the micromechanical parts, the term "micromechanical system" may be used to describe small integrated devices or systems which comprises one or more micromechanical elements and possibly, but not necessarily, electrical components and/or electronic components.

Micromechanical systems may be used as, for example, actuators, transducers or sensors, e.g. pressure sensors. Pressure sensors are nowadays mass products in automobile electronics and consumer goods electronics. For many of these applications, systems are used in which the sensor is integrated in an application-specific integrated circuit (ASIC). For example, Infineon Technologies AG offers such a system as a side-airbag sensor.

In particular, the mechanically active elements of a micromechanical system may typically require relatively complex structures, such as recesses, beams, cantilevers, undercuts, cavities etc. Possibly, a relatively high number of manufacturing steps are required. Furthermore, the process used for performing the micromechanical system may need to be compatible with possible subsequent manufacturing steps that are used for creating electrical and/or electronic components, for example.

The present invention relates to an integration of e.g. a lamella or a membrane into e. g. a 130 nm node, which has been studied only to a minor extend e.g. for a lamella or a membrane integrated within the substrate and describes a method for manufacturing the lamella or membrane without affecting previously implemented CMOS structures.

SUMMARY OF THE INVENTION

Embodiments of the present invention relate to a method for manufacturing a micromechanical system. The method comprises the steps of forming in a front end of line (FEOL) process a transistor in a transistor region. After the FEOL process, a protective layer is deposited in the transistor region, wherein the protective layer comprises an isolating material, e.g. an oxide. A structured sacrificial layer is formed at least in a region which is not the transistor region. Furthermore, a functional layer is formed which is at least partially covering the structured sacrificial layer. After the functional layer is formed removing the sacrificial layer in order to create a cavity between the functional layer and a surface, where the sacrificial layer was deposited on. The protective layer protects the transistor from being damaged especially during etching processes in further processing steps in MOL (middle of line) and BEOL (back end of line) processes. Using an oxide for said protective layer is advantageous, since the same oxide may be used as the basis for a metallization process in the BEOL. Therefore, the protective layer may remain over the transistor and does not need to be removed like the sacrificial layer, which is typically used as a protection for the transistor. Therefore, the protective layer becomes part of the oxide coverage, which is applied before the BEOL process.

According to an embodiment, the method may comprise a further step in which a thermal treatment is conducted, wherein the thermal treatment may activate doping atoms of the functional layer and provides a restructuring of the atomic structure of the functional layer. The restructuring of the atomic structure further creates a tension in the functional layer.

Embodiments show a height of the sacrificial layer, which is smaller than 100 nm or smaller than 75 nm or smaller than 50 nm. A sensitivity of a sensor, e.g. a pressure sensor, relates directly to the height of a cavity (and therefore the height of the sacrificial layer) between a membrane and a counter electrode. The smaller the height of the cavity the higher is the sensitivity of the sensor.

Further embodiments of the present invention relate to a method for manufacturing a pressure sensor. The method comprises the formation of a sacrificial layer at a surface of the semiconductor substrate, wherein a functional layer covering the sacrificial layer is formed. Furthermore, at least one hole is formed and the sacrificial layer is removed by applying a removing process through the at least one hole to create a cavity. Additionally, a thermal treatment is provided at a temperature between 550° C. and 750° C. and the at least one hole is closed.

Further embodiments of the present invention relate to a micromechanical system comprising a semiconductor substrate with at least one transistor in a transistor region and at least one metal layer above the at least one transistor where a lower surface of the at least one metal layer has a first vertical level. Furthermore, the micromechanical system comprises a functional MEMS layer in a MEMS region where the functional layer has an upper surface at a second vertical level which is lower than the first vertical level.

Further embodiments of the present invention relate to a method for manufacturing a micromechanical system. The method comprises the step of forming at least one transistor in a transistor region of a substrate. A structured sacrificial layer is provided in a MEMS region of the substrate, where a functional MEMS layer is formed at least partially covering the structured sacrificial layer, and providing etch holes in the functional MEMS layer. Furthermore, the sacrificial layer is removed to create a cavity and a further layer closing the etch holes is formed, wherein the further layer extends above at least a portion of the transistor region and forming at least one metal layer.

BRIEF DESCRIPTION OF THE FIGURES

Embodiments of the present invention are subsequently described in detail using the accompanying figures, in which

FIGS. 3A-3G show schematic cross-sectional views through a micromechanical system at several stages of a manufacturing process according to an embodiment;

FIG. 4 shows a schematic cross-sectional view through a micromechanical system according to an embodiment;

FIGS. 9A-9I show schematic cross-sectional views of a micromechanical system at several stages of a manufacturing process;

FIGS. 11A-11L show a schematic cross-sectional view of a micromechanical system at several stages of a manufacturing process according to an embodiment;

DETAILED DESCRIPTION OF EMBODIMENTS OF THE PRESENT INVENTION

Before embodiments of the present invention will be described in detail using the accompanying figures, it is to be pointed out that the same or functionally equal elements are given the same reference numbers or similar reference numbers in the figures and that a repeated description for elements provided with the same or similar reference numbers is typically omitted. Hence, descriptions provided for elements having the same or similar reference numbers are mutually exchangeable.

Micromechanical systems, e.g. pressure sensors and other sensors, are mass products. Sometimes the sensor or several sensors are integrated as a system in the form of, for example, an application specific integrated circuit (ASIC). When migrating towards new technology nodes, one of the challenges is to integrate these systems in such a manner that the complexity of, for example, a CMOS (Complementary Metal Oxide Semiconductor) process is not unnecessarily increased and that the existing integration scheme of the CMOS circuit can be preserved to a high extent, preferably with little or minimal development effort.

Figure 1A:
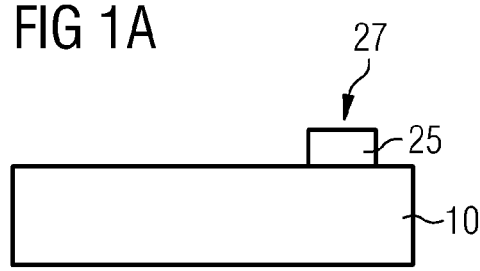
FIGS. 1A-1F show schematic cross-sectional views through a micromechanical system at several stages of a manufacturing process according to an embodiment.
Figure 1B:
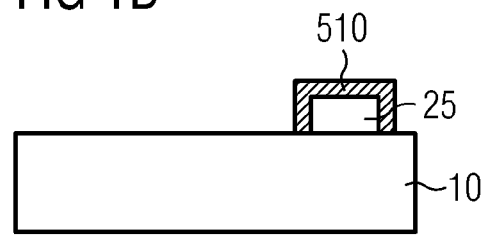
Figure 1C:
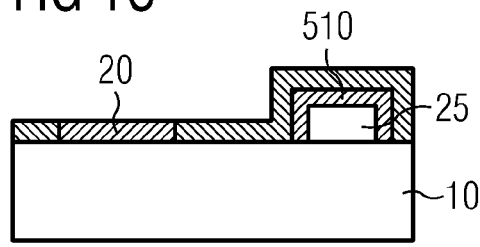
Figure 1D:
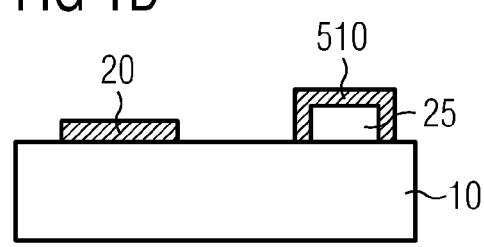
Figure 1E:
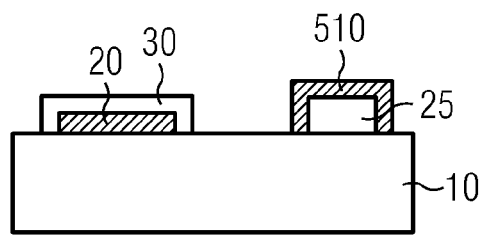
Figure 1F:
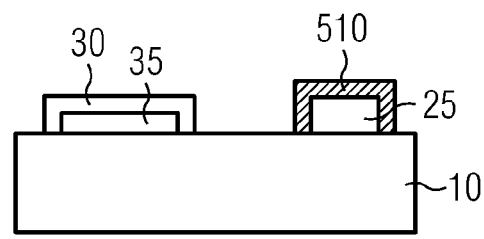

FIGS. 1a-e show schematic cross sections of a substrate 10 to illustrate a manufacturing process for obtaining a micromechanical system. FIG. 1a shows a transistor 25 or a plurality of transistors, formed in a front end of line (FEOL) process in a transistor region 27, e.g. on a substrate 10. After the completion of the FEOL-process, with respect to FIG. 1b, a deposition of a protective layer comprising an isolating material is shown. The isolating material is e.g. an oxide, e.g. FIG. 1c shows the substrate in a further processing step comprising the formation of a sacrificial layer 20 which may comprise carbon. In FIG. 1d, the sacrificial layer was structured to form a structured sacrificial layer 20. FIG. 1e shows the substrate 10 in a further processing step. A functional layer 30 is formed which at least partially covers the structured sacrificial layer, wherein the sacrificial layer 20 was removed as shown in FIG. 1f. Furthermore, there are optional steps applied to the substrate 10. With respect to FIGS. 11a-l, it is shown an embodiment, where an oxide layer is deposited over the transistor in the transistor region as a protective layer, which is advantageous especially for processes using a sacrificial layer 20 with a low height (cf. FIG. 10a-c). A low height may be lower than 150 nm, lower than 100 nm or lower than 75 nm.

The manufacturing process may further comprise a thermal treatment, wherein the thermal treatment activates doping atoms of the functional layer 30 and provides a restructuring of the atomic structure of the functional layer 30. Optionally, the functional layer may cover the sacrificial layer 20 completely. Therefore, a hole may be created in the functional layer 30. The hole may be used to apply a removing process to remove the sacrificial layer 20 to create a cavity between the functional layer 30 and the surface of the semiconductor substrate and wherein a layer is disposed at a surface of the functional layer to close the hole, wherein a height of the layer is below 600 nm. The layer may comprise a nitride or an oxide.

The manufacturing process may further comprise a back end of line (BEOL) process, wherein at least one metal layer is formed in the BEOL, which may be removed at least in a portion of a MEMS region e.g. to structure at least one metal line in the transistor region 27. After the at least one metal line was structured, at least one dielectric layer may be formed in the transistor region and the MEMS region. Furthermore, a thermal treatment may be provided to the functional layer 30 to provide a tension to the functional layer, wherein the temperature of the thermal treatment may be between 550° C. and 750° C.

Figure 2A:
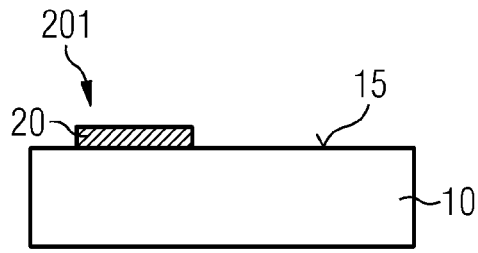
FIGS. 2A-2E show schematic cross-sectional views through a micromechanical system at several stages of a manufacturing process according to an embodiment.
Figure 2B:
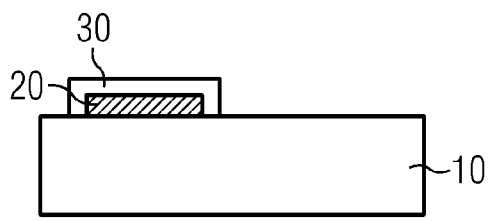
Figure 2C:
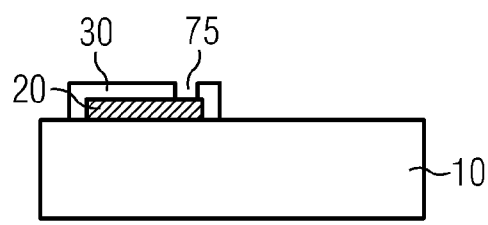
Figure 2D:
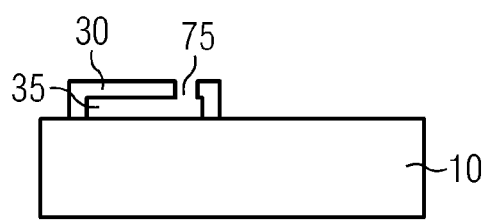
Figure 2E:
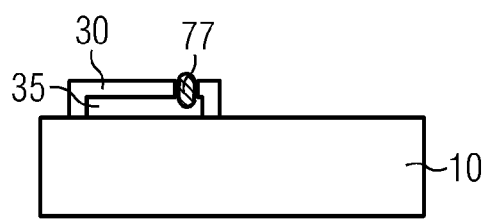

FIGS. 2a-e show schematic cross sections of a semiconductor substrate 10 to illustrate a manufacturing process for obtaining a pressure sensor 201. FIG. 2a shows the semiconductor substrate 10, wherein a sacrificial layer 20 is formed at a surface 15 of the semiconductor substrate 10. FIG. 2b shows the semiconductor substrate 10 in a further processing step, wherein a functional layer 30 is formed covering the sacrificial layer 20. In FIG. 2c, at least one hole 75 is formed in the functional layer 30 wherein the sacrificial layer 20 is removed by applying a removing process through the at least one hole 75 to create a cavity 35, which is shown in FIG. 2d. Furthermore, a thermal treatment at a temperature between 550° C. and 750° C. is provided to the semiconductor substrate 10. FIG. 2e shows the pressure sensor, wherein the hole 75 is closed e.g. with a filling material 77. Optionally, the manufacturing process may be performed between the FEOL and the BEOL. Furthermore, the thermal treatment may optionally provide a restructuring of the atomic structure and an activation of doping atoms of the functional layer, wherein the thermal treatment may transform amorphous silicon to polycrystalline silicon in the functional layer.

FIGS. 3a-e show schematic cross sections of a substrate 10 to illustrate a manufacturing process for obtaining a micromechanical system. FIG. 3a shows a transistor 25 formed in a transistor region 27 of the substrate 10. In FIG. 3b, a structured sacrificial layer 20 is provided in a MEMS region 60 of the substrate, wherein, as shown in FIG. 3c, a functional layer 30, e.g. a functional MEMS layer, is formed at least partially covering the structured sacrificial layer. FIG. 3d shows the substrate 10 in a further processing step, wherein a hole 75 or a plurality of e.g. etch holes 75, is provided in the functional layer 30. In FIG. 3e, the sacrificial layer is removed to create a cavity 35. In FIG. 3f, a further layer 45 is formed to close the etch holes. The layer 45 extends above at least a portion of the transistor region 27. FIG. 3g shows the micromechanical system, wherein at least one metal layer 65 is formed. Optionally, the layer 45 is a dielectric layer extending above at least a portion of the transistor region, wherein the at least one metal layer is formed above the dielectric layer. The layer 45 may be at least partially removed in the transistor region.

FIG. 4 shows a micromechanical system comprising a semiconductor substrate 10, at least one transistor 25 in a transistor region 27, and at least one metal layer 65 above the at least one transistor 25, a lower surface of the at least one metal layer 65 having a first vertical level 235. The micromechanical system further comprises a functional layer 30, e.g. a functional MEMS layer, in a MEMS region 60, the functional layer 30 having an upper surface at a second vertical 240 level which is lower than the first vertical level 235.

The functional layer may comprise polycrystalline silicon. Furthermore, the functional layer 30 may optionally comprise a hole, which is closed by a further layer. The height of the layer closing the hole may be below 600 nm. Additionally, the micromechanical system may comprise at least one dielectric layer extending in the MEMS region and the transistor region. Above the dielectric, the micromechanical system may comprise at least one metal layer in the transistor region. Furthermore, a cavity may be formed between the functional MEMS layer and the substrate 10.

FIGS. 5a-d show schematic cross sections of a processed substrate 10 and related structures to illustrate an exemplary manufacturing process for obtaining a micromechanical system. The manufacturing process comprises the formation in a front end of line (FEOL) process of a transistor 25 in a transistor region 27, wherein, after the FEOL process, a structured sacrificial layer 20 is formed at least in a region which is not the transistor region 27. A functional layer 30 is formed which is at least partially covering the structured sacrificial layer 20, and, after the functional layer 30 is formed, the sacrificial layer 20 is removed in order to create a cavity 35 between the functional layer 30 and a surface 15, having the sacrificial layer deposited thereon.

In general, the FEOL-process typically comprises the formation of the semiconductor substrate which may comprise the provision, planarization and cleaning of the wafer, depositing a shallow trench isolation (STI) and forming a well. Additionally, source, drain and gate terminals are formed which may build electrical or electronic components such as transistors. In other words, the FEOL process comprises the preparation of the semiconductor substrate whereupon metallization structures, which are separated by an insulation material, may be applied in a further back end of line (BEOL) process. The process described in the present invention may be applied between the FEOL and the BEOL process.

Figure 5A:
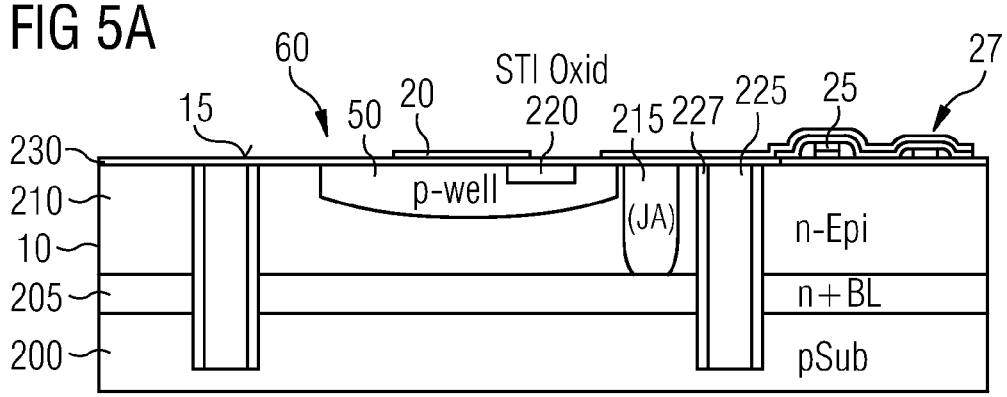
FIGS. 5A-5D show schematic cross-sectional views through a micromechanical system at several stages of a manufacturing process according to an embodiment.

To be more specific, FIG. 5a shows the micromechanical system comprising a processed semiconductor substrate 10, wherein at least one transistor 25 or a plurality of transistors is formed in a transistor region 27 on a surface 15 of the processed substrate. The processed semiconductor substrate 10 is obtained, for example, by the front end of line (FEOL) process. After the completion of the FEOL process, the processed semiconductor substrate 10 may comprise horizontally stacked layers, e.g. three different layers. A first layer may be a p-doped semiconductor substrate 200. A second layer may be a highly n-doped buried layer 205. A third layer may be a n-doped epitaxial layer 210. Even though, the doping type of the second and third layer may be the same, they may comprise different electrical properties due to a higher doping concentration of the buried layer 205 compared to the epitaxial layer 210. The layers of the horizontally stacked processed semiconductor substrate merge into one another due to the diffusion of the doping atoms. A deep sinker 215 connects the surface 15 of the processed semiconductor substrate electrically through the epitaxial layer 210 to the buried layer 205. The deep sinker may be again n-doped at a similar doping concentration than the buried layer 205. Furthermore, the epitaxial layer 210 may comprise a p-doped well 50 in a MEMS region 60. A surface of the well 50 may be part of the surface 15 of the processed semiconductor substrate. The well 50 comprises at least one trench of an STI (open shallow trench isolation) oxide 220 and at least one transistor 25 in a transistor region 27. Between the MEMS region and the transistor region, the processed semiconductor substrate comprises an isolated electrically conductive via 225. Optionally, the surface 15 of the processed semiconductor substrate 10 may be covered by a passivation layer 230. The passivation layer may be removed at those areas, where an electrical contact to the substrate 10 is required and in at least a portion of the MEMS region 60. With regard to the above specifications, it should be noted that complementary doping types may be utilized. The present invention is further applicable to other CMOS technologies.

After the FEOL process, a sacrificial layer 20 is deposited by means of, for example, a chemical vapor deposition (CVD) process, an ion deposition process, an ion-assisted sputtering, a sputtering process, a cathodic vacuum arc process, a plasma deposition process, and/or a pulsed laser deposition at the surface 15 of the processed semiconductor substrate 10. The sacrificial layer 20 may comprise carbon materials. Furthermore, the sacrificial layer 20 may be structured, e.g. by a lithography and etching process, or it may be deposited as a structured sacrificial layer. A lateral boundary may be defined to laterally delimit the sacrificial layer so that it covers a certain portion of the surface of the substrate, wherein a remaining portion of the surface of the substrate is exposed or at least not covered by the sacrificial layer 20. The sacrificial layer may also be structured to have a lateral shape with at least one vertex or corner. The structure of the sacrificial layer defines the dimension at an accuracy of, e.g. 20 nm, and a height at an accuracy of, e.g. less than 6%, e.g. ±2 . . . 3%, of a cavity, which remains after the sacrificial layer is removed in a further processing step.

Figure 5B:
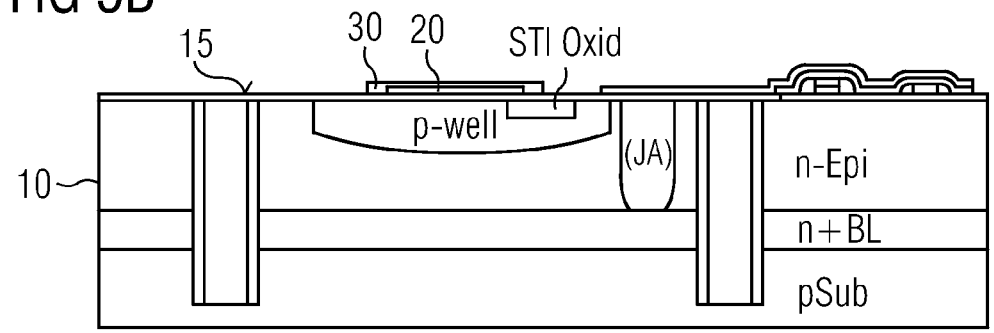

FIG. 5b shows the processed semiconductor substrate 10, wherein a functional layer 30 is deposited on the surface 15 of the processed semiconductor substrate 10 such that the sacrificial layer 20 is covered. The functional layer 30 may be deposited such that the sacrificial layer 20 is covered at least partially, e.g. by using a further lithography step to structure the functional layer 30, or such that the functional layer 30 covers the sacrificial layer 20 completely, as it is shown in FIG. 1b. The functional layer is deposited by means of, for example, a chemical vapor deposition (CVD) process, an ion deposition process, an ion-assisted sputtering, a sputtering process, a cathodic vacuum arc process, a plasma deposition process, and/or a pulsed laser deposition with an accuracy of the height of e.g. less than 6%, e.g. ±2 . . . 3%.

The functional layer 30 may comprise an in situ p-doped amorphous silicon, e.g. comprising boron in the dopant, in order to derive required or desired electrical properties and/or mechanical properties, such as a higher mechanical stiffness or a better electrical or thermal conductivity. The functional layer may be deposited using a polylayer in situ deposition and structuring. The process requires a comparably low temperature of, e.g. between 300° C. and 600° C., or between 400° C. and 500° C., or about 440° C., which may preserve the electrical properties of the processed semiconductor substrate.

Figure 5C:
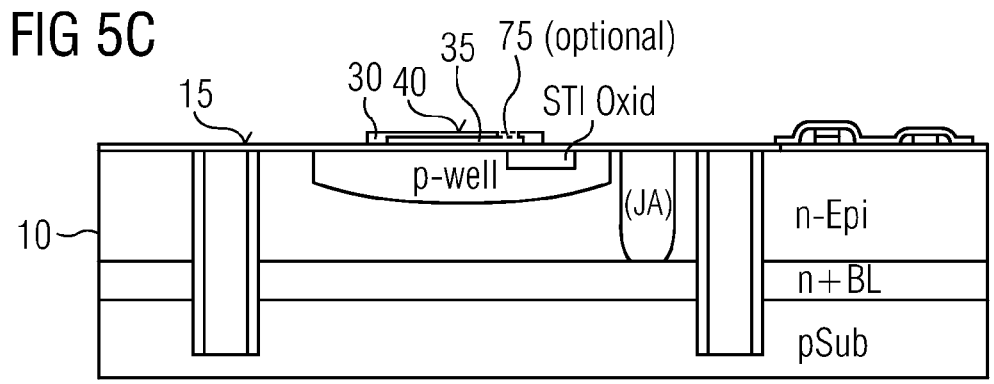

FIG. 5c shows the processed semiconductor substrate 10, wherein the sacrificial layer 20 is removed by a removing process, such that a cavity 35 between the surface of the processed semiconductor substrate 15 and the functional layer 30 is obtained. The removal process may comprise at least one of a thermal decomposition process, a dry etching process, and an ashing process. In case the sacrificial layer 20 is covered completely with the functional layer 30 (see FIG. 5b), it is possible to create at least one hole 75 in the functional layer to enable access for the removing process to the sacrificial layer 20. The one or more holes 75 may be arranged adjacent or close to an edge of the functional layer 30. In other words, the hole(s) extend(s) from an exposed surface 40 of the functional layer 30 to a surface of the sacrificial layer 20. The at least one hole 75 leads from the exposed surface 40 to a margin region 80 of the sacrificial layer 20. The holes may be located in the corners of the functional layer 30. Depending on the configuration of the manufacturing process, it may be possible that the holes do not require a dedicated mask, but can be structured concurrently with other structures using the same mask. Alternatively or in addition, residual products such as the etching agent in a wet etching process or a gas in a dry etching process may leave the cavity 35 that is being created by removing the sacrificial layer 20 through the at least one hole.

If the functional layer 30 covers the sacrificial layer 20 only partially, the removing process can be applied through those areas where the sacrificial layer 20 is not covered by the functional layer 30.

The removal of the sacrificial layer 20 may be supported by the use of a material that exhibits an extreme selectivity regarding the etch rate to the etch velocities of the surrounding materials. In this manner, the complete sacrificial layer 20 may be removed even from remote points of the functional layer 30. Furthermore, the removal may be obtained by a dry etching process such that problems such as sticking during the process are not to be expected. The resulting cavity may have a lateral range of e.g. 20 μm at an accuracy of e.g. 20 nm and a height of e.g. less than 500 nm, less than 300 nm, or less than 100 nm, at an accuracy of the height of e.g. less than 15%, less 10%, or less than 5%.

A further step may be the application of a thermal treatment to the functional layer 30. The thermal treatment may cause a restructuring of the atomic structure of the functional layer, i.e. the functional layer may be tensed and/or healed. Further, the doping of the functional layer may be activated. The tension, e.g. an (intrinsic) tensile stress, may be obtained by e.g. a heat induced transformation of amorphous silicon to polycrystalline silicon in the functional layer. This combination of the activation of the doping and the restructuring of the atomic structure in a single thermal treatment is a further step in this invention. Furthermore, the comparably low temperature in an optimal range of, e.g. 450° C. to 850° C., or 550° C. to 750° C., and the short duration of the thermal treatment time of, e.g. less than 90 minutes, less than 60 minutes, or less than 30 minutes, limits the impact on the processed semiconductor substrate 10 after the FEOL-process. Thus, the transistor(s) 25 and optionally build other electronic components preserve their specifications. Otherwise, they would need to be redefined in an elaborate process.

Figure 5D:
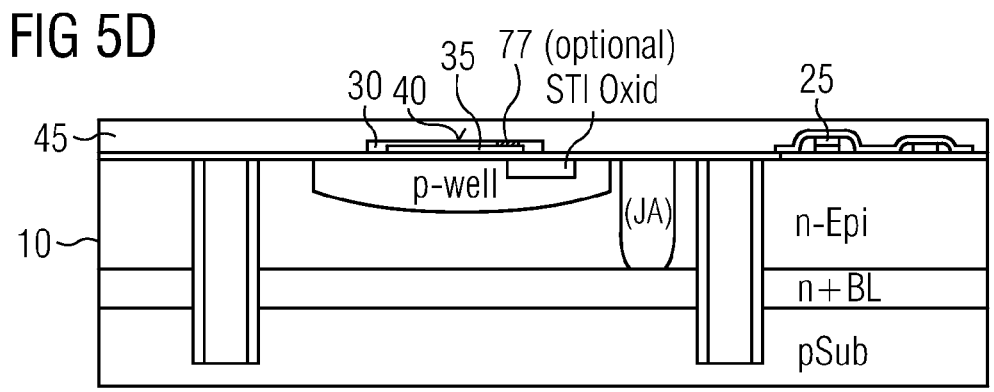

FIG. 5d shows the micromechanical system where an optionally deposited layer 45 may cover the surface 15 of the processed semiconductor substrate 10, the functional layer 30, and the transistor 25. If the hole 75 has been created previously, the layer 45 may be arranged inside the hole such that the cavity 35 is sealed. At the same time, a portion of the cavity 35 that is beneath the at least one hole 75 might also be filled with the same filling material 77. This portion of the cavity is typically filled due to a side effect of filling the at least one hole. As mentioned above, the at least one hole 75 is adjacent to, or in an extension of, the margin region of the sacrificial layer 20 and hence also adjacent (typically in a direction orthogonal to the surface 15 of the substrate 10) to a margin region of the cavity 35. Nearby side walls, e.g. a part of the functional layer 30, and the bottom bounding the cavity 35 may lead to a locally confined deposition of the filling material 77 within the cavity (e.g. due to adhesion effects) so that the portion of the cavity 35 that is filled makes up only a small fraction of the entire cavity. Moreover, the filled cavity portion is within a margin portion of the cavity 35, i.e. close to a lateral boundary of the cavity, so that a clear width of the cavity is reduced only to a minor or negligible extent by the filled cavity portion. The filling material 77 may be a material forming or comprised by the layer 45, which may be e.g. an inter layer dielectric (ILD) material of an ILD layer.

The margin region of the sacrificial layer 20 may be regarded as a region close to a lateral circumference of the sacrificial layer, compared to an overall lateral extension of the sacrificial layer 20. The width of the margin region may depend on the geometric structure and/or the micromechanical properties of the functional layer 30. For example, the margin region may be relatively wide in an area near the corners of the sacrificial layer 20, and more narrow near the centers of the edges. Alternatively or additionally, the lateral cross sectional area of the at least one hole 75 may be defined as being at most 5% of the lateral cross sectional area of the cavity 35, optionally, preferably at most 4% or 3% or 2% or 1%. From these optional definitions it becomes clear that a portion of the functional layer that is adjacent to a central portion of the sacrificial layer (and an eventually created cavity after removal of the sacrificial layer) is free of holes, as these are (exclusively) located in the margin region. According to some embodiments the margin region may extend from the lateral boundary of the sacrificial layer in a direction perpendicular to the lateral boundary by at most 30% of a largest lateral extension of the sacrificial layer 20.

Arranging opening points, e.g. holes 75, in the margin/corner region allows for a high degree of freedom when closing the openings or hole 75. Since the corners only play a minor role with respect to the membrane's (functional layer's) mechanical properties and displacement under forces acting in orthogonal direction to the membrane (functional layer), maintaining the cavity 35 (immediately) under the further layer 45 closing the hole 75 is not absolutely mandatory (i.e., maintaining the cavity portion directly under the filled hole and in the vicinity).

Furthermore, it may be also possible to remain the hole 75 opened, e.g. to allow a pressure compensation. Additionally, it may be also possible to create a hole 75 in the functional layer 30 which partially covers the sacrificial layer 20, e.g. to optimize the removing process.

In order not to influence further processing steps, e.g. a polishing step, the layer may comprise a maximum height that is, e.g., less than 1500 nm, less than 1000 nm, or less than 600 nm. The height may be the distance between the surface 15 of the processed semiconductor substrate 10 and an exposed surface of the layer 45, perpendicular to the surface of the processed semiconductor substrate 10. The layer 45 may comprise one of a nitride or an oxide.

The deposition of the layer 45 is processed in a high vacuum environment, comprising a pressure of, e.g. less than 100 mTorr, less than 50 mTorr, or less than 10 mTorr. The vacuum may support the cavity evacuation from e.g. residuals of the etching process or a gas of a dry etching process using high density plasma. In other words, it may be a joint evacuation, closure and ILD deposition obtained. The layer 45 may be a first step of a BEOL process comprising e.g. further CMOS processes such as a surface polishing step.

The BEOL-process may comprise building a horizontal stack of metallization structures, e.g. metal layers or metal lines, and intermediate dielectric layers. The stack is formed or deposited to form a wiring or interconnections of the micromechanical system. Typically, the metal layers are deposited and structured, e.g. in a lithography process, to form a metal line between different transistors 25, wherein the metal line may form an electrical connection. A dielectric layer isolates the connections and builds a basis for a further metal layer, which is again structured. Connections between different metallization layers may be e.g. provided by vias through the dielectric layers. The steps of depositing a dielectric layer, depositing a metallization layer, and structuring the metallization layer to form at least one metal line may be repeated until the whole wiring is completed. Additionally, further layers may be deposited in the stack forming intermediate layers, for example, to form an etch stop for an etching agent. Furthermore, at least in a part of the MEMS-region, all layers of the BEOL-process, i.e. every layer that is deposited after the functional layer, is removed to provide access to the functional layer. The removed part of the layers forms a trench in the stack. Nonetheless, there are no further high temperature steps necessary which are able to harm the processed semiconductor substrate, especially the doping of the processed semiconductor substrate, or the tension and/or the doping of the functional layer.

In the context of technologies with structure widths of 130 nm and below, for example the topology of front-end-of-line structures plays a relatively important role. Embodiments allow that a total thickness does not exceed a few hundred nanometers, in order not to impair a BPSG (borophosphorsilicate glass) polishing step which is often present. Furthermore, according to the embodiments, a reduction for as few as possible intermediate steps and the sharing or joint use of existing processes is achieved to facilitate a successful integration, i.e. the prerequisites for a successful integration are fulfilled.

With respect to pressure sensors, one option is provided by integrated pressure sensor structures that use a polycrystalline silicon blade or a membrane which is formed on a substrate. The used process employs 5 to 6 mask layers and an elaborate process for removing a sacrificial layer between the blade and the substrate. In this form, the present process is hardly integratable in a CMOS process. The present invention only uses 2 to 3 mask layers and a CMOS compatible removing of the sacrificial layer and is therefore much better integratable in a CMOS process, even in connection with an integration into a 130 nm node.

Furthermore, a doped semiconductor, e.g. the functional layer, typically requires an activation, e.g. if an ion implantation technique is used. The dopant first remains on an interstitial of the crystal lattice of the substrate, which comprises e.g. silicon, where the dopant has no effect. Additionally, the ion implantation destroys parts of the crystal lattice due to collisions of the dopant shot into the lattice and molecules of the crystal lattice, e.g. silicon molecules. A thermal treatment, e.g. an annealing, of the doped semiconductor activates the doping, i.e. molecules of the dopant are integrated in the crystal lattice, and the processed semiconductor substrate is healed by replacing missing molecules, both due to an increased thermal motion of the molecules. Besides these positive effects, a diffusion of the dopant takes place. The diffusion increases with an increased duration and an increased temperature of the thermal treatment. Therefore, embodiments of this invention achieve a limitation of the thermal treatment.

To this end, if there is a hole 75 created in the functional layer 30, which is e.g. a membrane, the hole(s) 75 may be performed at the corner(s) or the margin of the sacrificial material or the cavity 35. Hence, the lithography process for structuring the polycrystalline blade can be used, in a joint manner, for hole etching. Furthermore, it is possible to use a process for closing, filling, or plugging, which does not necessarily has to preserve a portion of the cavity 35 (directly) under the hole 75 within the blade. The process might be included in the deposition of the layer 45, which may be e.g. an ILD layer.

The functional layer 30 may be formed as a polycrystalline silicon blade or a membrane and may build a pressure sensor. The variant proposed integrates the pressure lamella once the CMOS structures have been completed, and reduces the number of structuring lithography processes. Depending on the process management, it is also possible to simultaneously use the sealing oxide as an ILD prior to contact hole structuring. In this manner, maximum utilization of existing processes within the CMOS process is achieved.

Opening of the membrane is performed, for this purpose, exclusively on the corners or sides, so that, for one thing, the lithography process may be used for structuring the poly-lamella for hole etching; in addition, it becomes possible to utilize, for the closure or sealing, a process which does not necessarily need to maintain the cavity 35 below the hole 75 within the lamella.

By means of suitable temperature treatment, the lamella is modified such that in addition to activation of the dopants, tensile stress is also achieved. All of the layers supported on the sensor lamella are removed later on by means of a dry etching process and in one implementation variation replaced by thin passivation. Further specific processes are the dry evacuation of the cavity (e.g. etching of the sacrificial layer), activation of the dopants and the application of a tensile stress to the lamella, and the combination of closure or sealing of the evacuation holes and ILD deposition.

According to embodiments, a suitable selection of the integration concept for a pressure sensor lamella is achievable. This includes insertion of the lamella once essential parts of the transistor structures of the surrounding CMOS circuit have been completed (following FEOL processing), temperature treatment with suitable parameters in a manner which does not impair the CMOS circuit, and simultaneous evacuation of the cavity and deposition of part of the bottommost interlayer dielectric, in which the bottommost contact level will be structured at a later point in time. Thus, existing process sequences may be used in the CMOS process (only 2 to 3 additional mask levels for integrating a pressure sensor).

Figure 6:
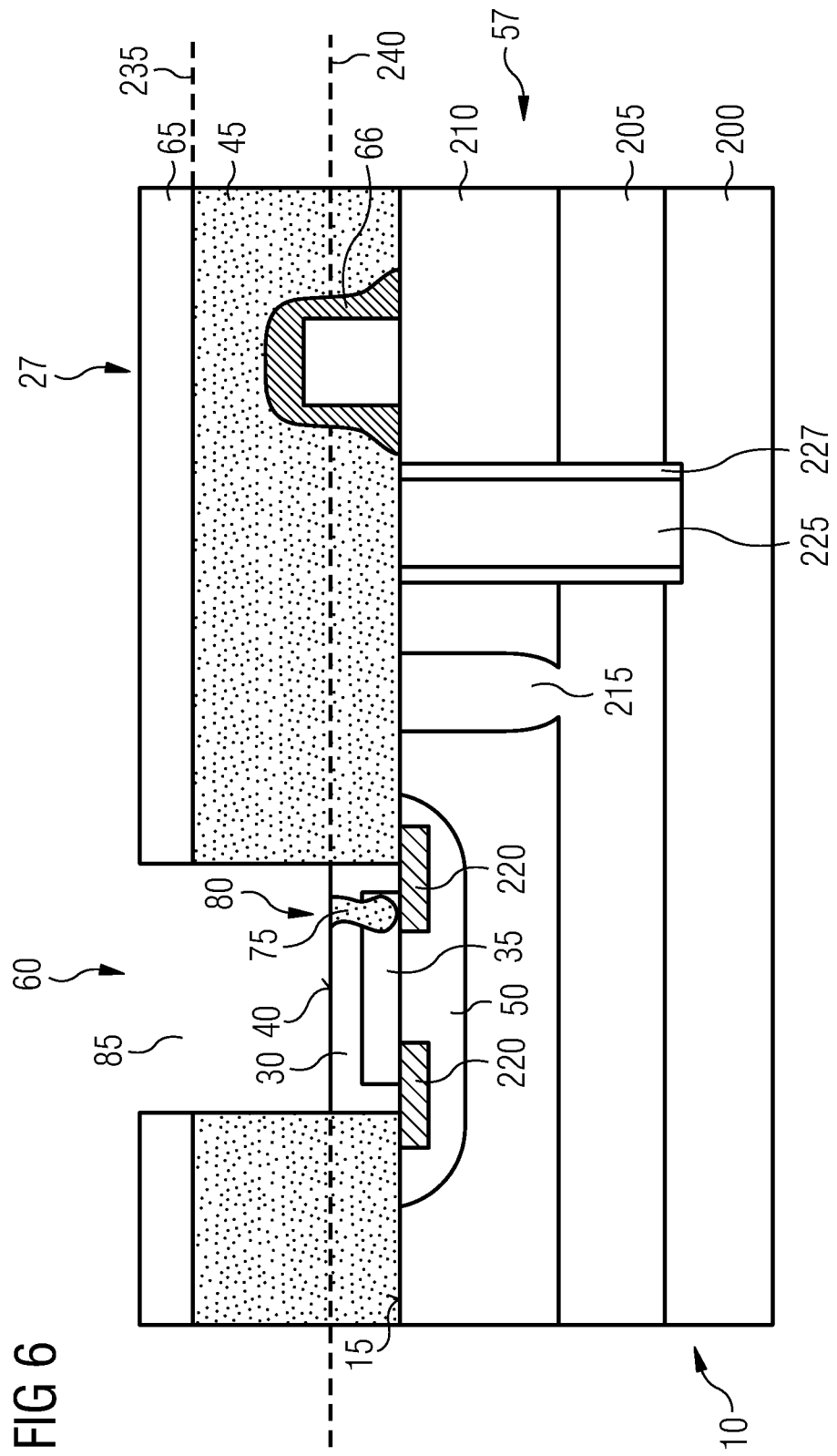
FIG. 6 shows a schematic cross-sectional view of a micromechanical system according to an embodiment.

FIG. 6 provides a schematical crossectional view through an exemplary micromechanical system, which may, for example, implement a pressure sensor. The micromechanical system 57 comprises the processed semiconductor substrate 10 and at least one transistor 25 in the transistor region 27. The transistor may comprise a spacer oxide or a spacer nitride 66 at the gate electrode. When the processed semiconductor substrate is regarded as a lowest structural part, at least one metal layer 65 is built above the at least one transistor 25 with a lower surface of the at least one metal layer 65 having a first vertical level 235, which is the surface facing the transistor 25. Furthermore, a functional layer 30 is arranged, which is, e.g. a MEMS layer, in a MEMS region 60. The functional layer 30 comprises an upper surface at a second vertical level 240 which is lower, i.e. closer to the surface 15, than the first vertical level 235. The functional layer 30 may comprise polycrystalline silicon and optionally comprises a hole 75, which may be filled with a filling material 77. The filling material 77 may comprise, e.g. an ILD material, which may extend to or into the cavity 35.

The at least one transistor 25 may be configured to provide, e.g. an electrical circuitry, for example to transduce or process a variation of physical properties of the functional layer. The at least one metal layer 65 above the at least one transistor 25 is configured to provide an electrical contact to at least one transistor 25. The functional layer 30 in the MEMS region 60 is, for example, a functional part in a sensor, wherein the functional layer 30 is configured to change its physical properties, e.g. due to different ambient pressures (acting on the functional layer 30). The physical properties of the functional layer may be, e.g., the conductivity of the functional layer. The layer 45 and optionally more/other layers, e.g. horizontally stacked ILD and metal layers/metallization structures/metal lines/at least one metal layer 65, covering the functional layer 30, may extend above at least a portion of the transistor region 27 during the manufacturing process. Nonetheless, the layers are removed in further steps of the manufacturing process at least in a part of the MEMS area 60, forming a trench 85 to provide access to the functional layer 30, which is, e.g. a sensory part of the micromechanical system.

The well 50 is located adjacent to the surface 15 of the semiconductor 10. Typically, the well 50 comprises the same doping type as the doped substrate 200, however at a higher doping concentration resulting in a higher electrical conductivity of the well 50 compared to the doped substrate 200. For example, both the doped substrate 200 and the well 50 may be p-doped, and the doping level of the well 50 may be 2 to 5 orders of magnitude higher than the doping level of the doped substrate 200. The high doping concentration of the well 50 may be created by means of an ion implantation process or a diffusion process, followed by a thermal treatment such as a furnace anneal or a rapid thermal anneal (RTA). The well 50 may be used as a (counter) electrode in a manufactured micromechanical system or micromechanical pressure sensor.

Figure 7:
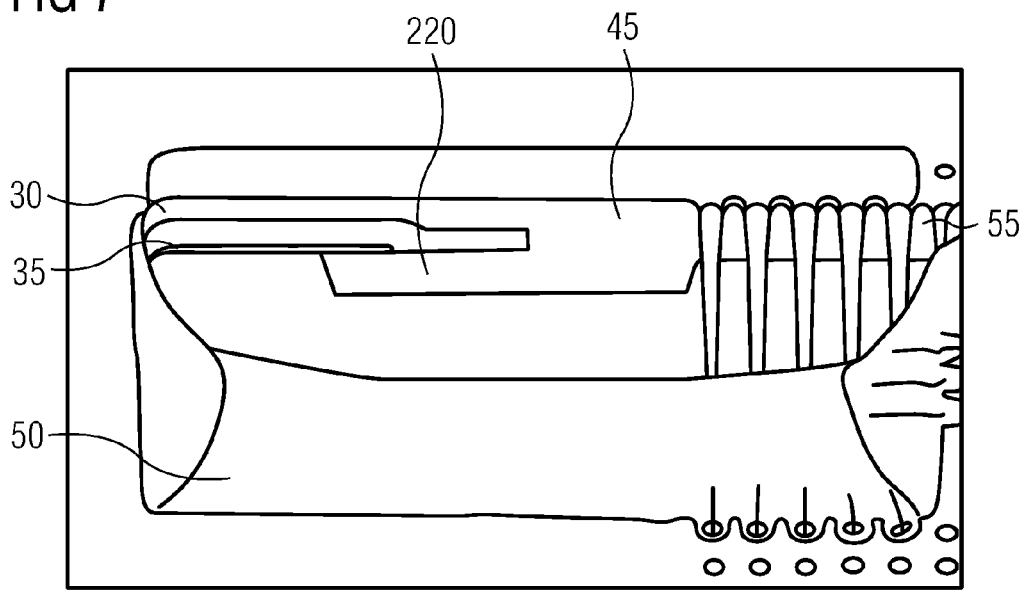
FIG. 7 shows a schematic cross-sectional view, obtained by FIB (focused ion beam), of a section of a micromechanical system according to an embodiment.

FIG. 7 shows a cross-sectional view, precisely a schematical FIB (focused ion beam) section, of the micromechanical system which may be, e.g. a pressure sensor. The functional layer 30 is deposited on the area of the processed semiconductor substrate 10 where the doped well 50 is arranged. Nonetheless, the functional layer 30 is electrically insulated from the doped well 50, for example by the cavity 35 or the STI oxide 220, which is deposited in the well 50. Furthermore, the surface 15 of the processed semiconductor substrate 10 and the functional layer 30 are covered by a layer 45. For contacting the well 50, e.g. by an external circuitry, electrical contacts 55 are built adjacent to the layer 45 and the functional layer 30. A Part of the layer 45, which covers the functional layer 30 at least in an area perpendicular to the surface 40 of the functional layer, may be removed in a further processing step, to prevent the sensitivity of the functional layer 30 from being affected by, e.g. a different mechanical strength of the layer 45. Furthermore, the functional layer 30 offers a typical degree of crystallization, obtained by the thermal treatment of the functional layer after the FEOL process, which is typical for this invention. A REM direct light microscopy or a cross-sectional breaking may illustrate the structure.

The functional layer may eventually form one of a membrane, a beam, a lever, a cantilever, etc. of the micromechanical system once the micromechanical system is build. The functional layer thus becomes a mechanical transducing or mechanically active element. Because of the cavity that has been formed adjacent to the functional layer, at least a portion of the functional layer is able to move in response to a mechanical force, a pressure, an acceleration, an electrical force, and other physical influences.

Figure 8:
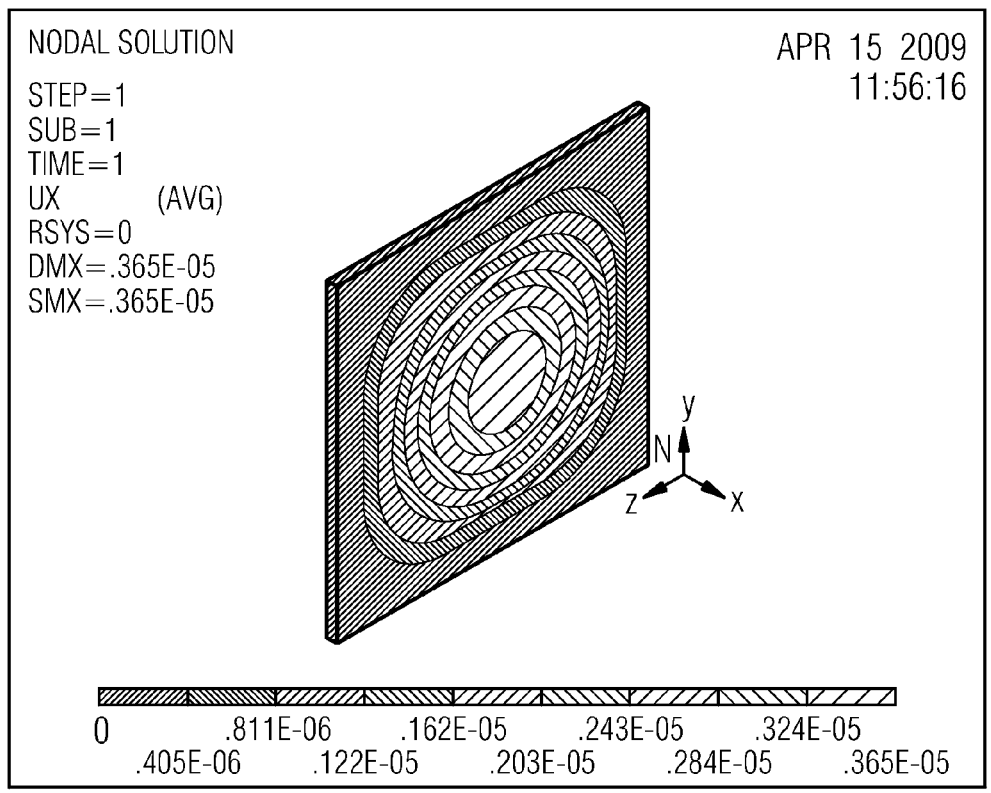
FIG. 8 schematically illustrates the results of a numerical simulation of the displacement of a membrane with a pressure of 1 bar acting on it.

FIG. 8 shows the result of a finite element method (FEM) simulation of the functional layer 30 that is exposed to a pressure of 1 bar. For the sake of simulation, the functional layer 30 is a membrane, was assumed to be 300 nm thick, and clamped at all four sides. As may be expected, the maximal displacement (3.65 nm) can be observed in the middle of the functional layer 30. On the other hand, the distance of the equidistance surfaces to the membrane edge makes it clear that in the corners of the membrane the smallest displacement is to be expected.

The previous description mainly focuses on the MEMS region and how to create the cavity below the functional layer 30. The following FIGS. 9 to 12 focus on the transistor region and how to protect the at least one transistor from being affected (e.g. damaged or influenced) while the MEMS element in the MEMS region is formed. Therefore, details of the MEMS region such as, for example, the hole or how to close the hole are neglected in the following figures.

For further developing microelectromechanical systems (MEMS) with improved performance at lower costs, it is advantageous to have the possibility to integrate the MEMS procedures monolithically in existing CMOS technology. Different ways of the monolithic integration have been tested: these are the "MEMS first" and "MEMS last" approaches, wherein the MEMS structure is produced either before or after the CMOS procedures. Another approach is the "transfer and join"—technology, where MEMS structures are pre-produced on a separate wafer and being transferred on a CMOS wafer later on.

A further option of the MEMS integration is the "interleave" technique, where CMOS and MEMS procedures are alternating. Therefore, usually the whole MEMS process is included in the CMOS processing. This enables a perfect integration of both elements.

One of the challenges is that neither the procedures to form the MEMS components influence the CMOS functionality nor, the other way round, further CMOS processes influence or even destroy previously formed MEMS structures. Furthermore, standard CMOS processes should be used to form the MEMS structures, in order to obtain a low overall complexity. Therefore, especially for the integration of a horizontal pressure sensor in a middle of line process in the CMOS technology, a logical area (or transistor region) of the CMOS technology needs to be sufficiently protected, where a robust process control is advantageous.

Figure 9B:
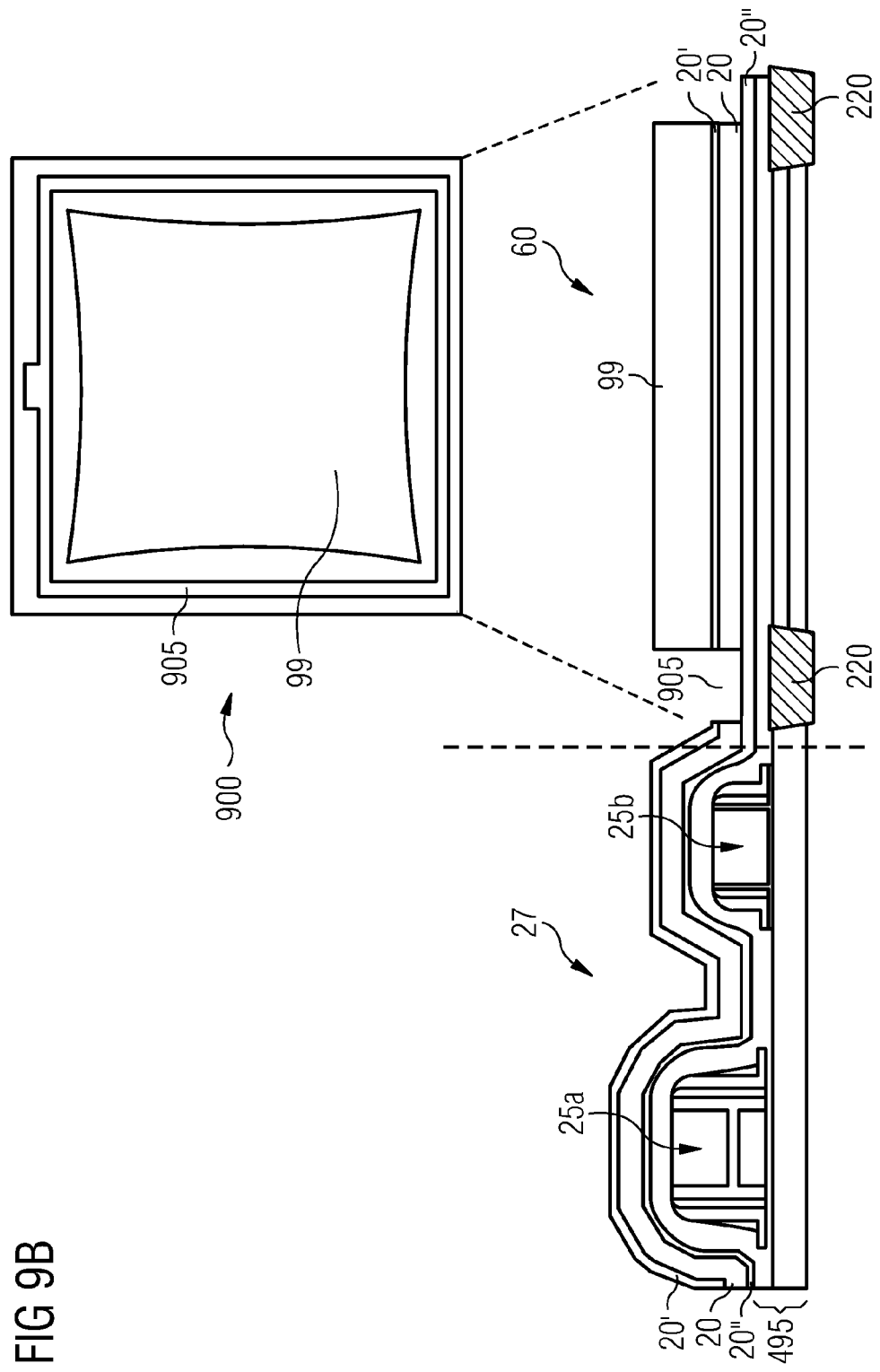

FIGS. 9a to e show a schematic cross-sectional view of a micromechanical system at several stages of a manufacturing process. FIG. 9a shows a (i.e. FEOL-) processed semiconductor substrate 495 (showing the topmost layers of the substrate). The semiconductor substrate 495 may comprise cobalt silicide (CoSi) 497 on a positive doped area in a negative well (BP/NW) 496, such that the sensor in the MEMS region 60 is formed on the cobalt silicide and the positive doped area in the negative well. The MEMS region 60 may be also referred to as a sensor field and the transistor region 27 may be also referred to as a logic field. Furthermore, the processed semiconductor substrate may comprise a shallow trench isolation 220, comprising siliconoxide (e.g. SiO or $SiO_2$) in the MEMS region. In the processed semiconductor substrate 495, a first and a second transistor 25a, 25b is formed in the transistor region 27. According to embodiments, the transistors might be a plurality of transistors forming a flash memory cell such as e.g. an eProm (erasable and programmable read only memory) etc. or a logic device. Furthermore, the layers 20", 20 and 20' are deposited on the processed semiconductor substrate 495. The layer 20' and 20" may comprise silicon nitride (Si$_3$N$_4$). A typical height of the layer 20' may be 25 nm (e.g. between 15 nm and 50 nm). A typical height of the layer 20" may be 12 nm (e.g. between 8 nm and 25 nm). The layer 20" may be an anti-stress layer and the layer 20' may be a hard mask protecting the carbon sacrificial layer 20 during further etching processes. For removing the carbon sacrificial layer 20, it may be used a lack strip (e.g. a plasma ashing) process. Between layers 20' and 20", the layer 20 is arranged, e.g. deposited using plasma activated chemical vapor deposition (PCVD). The layer 20 may comprise carbon. A typical height of the layer 20 may be between 50 nm and 70 nm. The layers 20, 20' and 20" may be referred to as a CVD plasma sacrificial layer stack. Furthermore, a semiconductor lithography mask 99 may be applied to enable the structuring of the carbon sacrificial layer 20 or more precisely, the layer 20" and the layer 20. The lithography mask is e.g. a resist mask with organic ARC resist JSR M91Y. This may be a resist mask covered by an anti-reflexion coating. A typical height of the lithography mask may be 450 nm (e.g. 300 nm-650 nm).

At the bottom of FIG. 9b, the layers 20 and 20' forming the (i.e. etching) in the MEMS region 60 to a size of the lithography mask 99. Therefore, the trenches 905 remain, since the etching process is designed to stop on the nitride. After the etching process, the lithography mask (resist) is removed, e.g. using an insitu strip process. Above the cross-sectional view at the bottom of FIG. 9, the MEMS region is illustrated in a top view 900.

At the bottom of FIG. 9c, the deposition of a e.g. Bor pre-doped amorphous silicon functional layer 30 is shown, which is transformed into polycrystalline silicon in an annealing or a similar heating process. According to embodiments, the layer 30 comprising amorphous silicon is, after transformation into polycrystalline silicon, the future membrane of lamella of the sensor in the MEMS region. The functional layer 30 may comprise a typical height of 300 nm. A lithography mask 99 may be deposited over the functional layer 30 in the MEMS region 60, leaving at least one free space e.g. at one or more of the corners of the layer 30 in the area of the carbon layer 20. Therefore, the following etching, such as an anisotropic etching, of the functional layer 30 removes the layer 30 in the transistor region and in parts of the MEMS region, which are not covered by the lithography mask 99 leaving at least one hole 75. The at least one hole may comprise a width or a diameter of typically 500 nm (e.g. between 300 nm and 700 nm) and a typical height of 50 nm (e.g. between 25 nm and 150 nm). Since a free space was left in the lithography mask over the carbon sacrificial layer 20, a part of the carbon sacrificial layer 20 is exposed after the previously described (anisotropic) etching process, e.g. through the at least one hole 75. In a further etching process, such as an isotropic etching process, silicon residues in the transistor region and/or at edges of carbon layer are removed.

A top view of the MEMS region 60 is illustrated without covering resist above the cross sectional view of FIG. 9c. According to an embodiment, the exposed carbon sacrificial layer 915 is located at the corners of the future sensor in the MEMS region. A further top view illustration is shown with respect to FIGS. 9f and 9g.

At the bottom of FIG. 9d, the strip, e.g. a micro wave strip, of the (carbon) sacrificial layer 20 shown and the resist mask 99. This may be performed using plasma ashing. The resist mask 99 may be removed e.g. within 1 s to 10 s. However, the strip, such as the plasma ashing, is typically applied for e.g. 2 min to 15 min. A further schematic cross sectional view 920 of the MEMS region after the strip is shown at the top of FIG. 9d. The hole 915 used to remove the sacrificial layer may be closed using the further layer 45, which may be a HDP (high density plasma) oxide.

FIG. 9e gives a schematic illustration of the whole substrate similar to the illustrations shown in FIG. 5. In addition to FIG. 9d, the further layer 45, for example an oxide layer, was deposited on top of the transistor region and the MEMS region. In a further step, the further layer 45 may be polished to form a plane surface at a desired height for further metallizations in a back end of line (BEOL) process. Since the processing steps described with respect to FIGS. 9a to e are performed between the FEOL and the BEOL, these steps are also referred to as the middle of line (MOL) process.

Figure 9F:
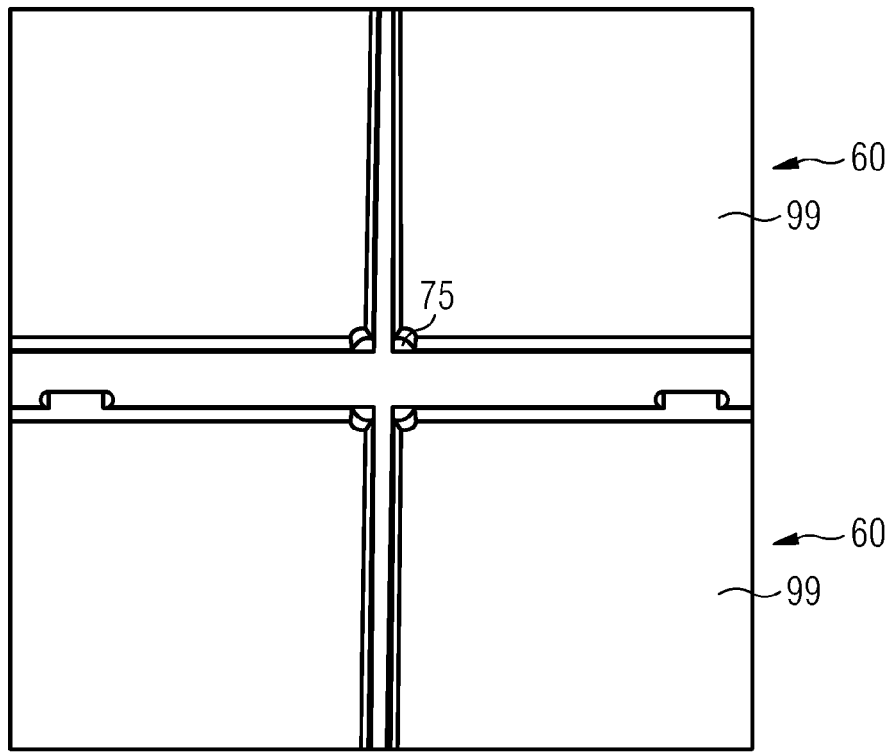
Figure 9G:
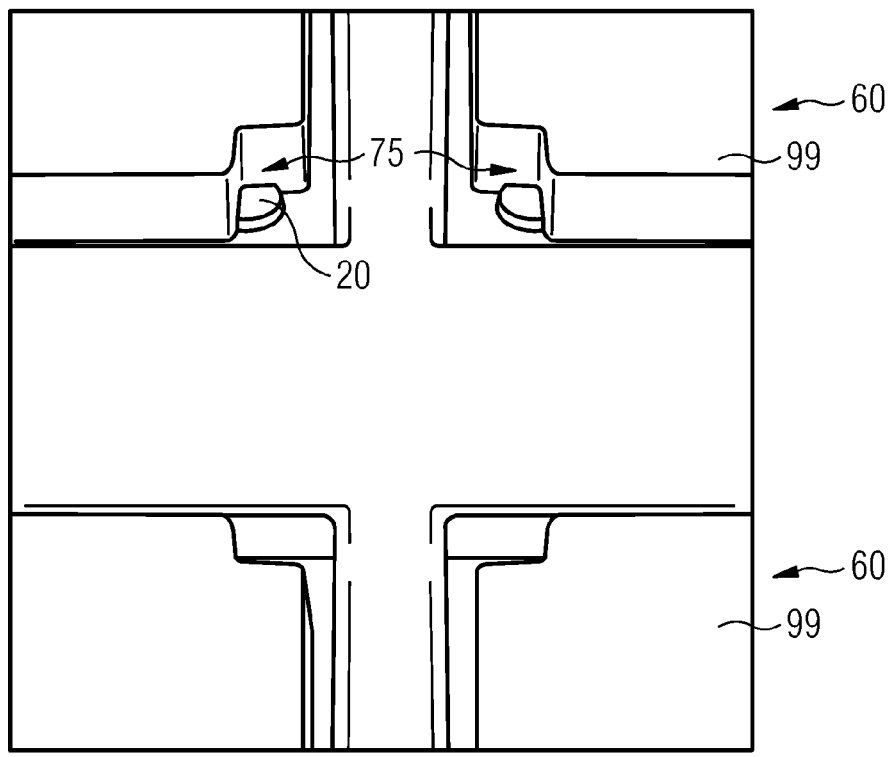

FIGS. 9f and 9g show a schematic top view of four MEMS regions 60 similar to the top view illustrated on top of FIG. 9c. FIG. 9g shows an enlarged representation of FIG. 9f, focusing on the holes 75 and the exposed (carbon) sacrificial layer 20.

FIG. 9h shows a schematic cross sectional view similar to the cross sectional view illustrated at the top of FIG. 9d. FIG. 9g shows an enlarged representation of FIG. 9h, focusing on the cavity 35. According to the described embodiment, a height of the cavity is 119 nm.

Figure 10A:
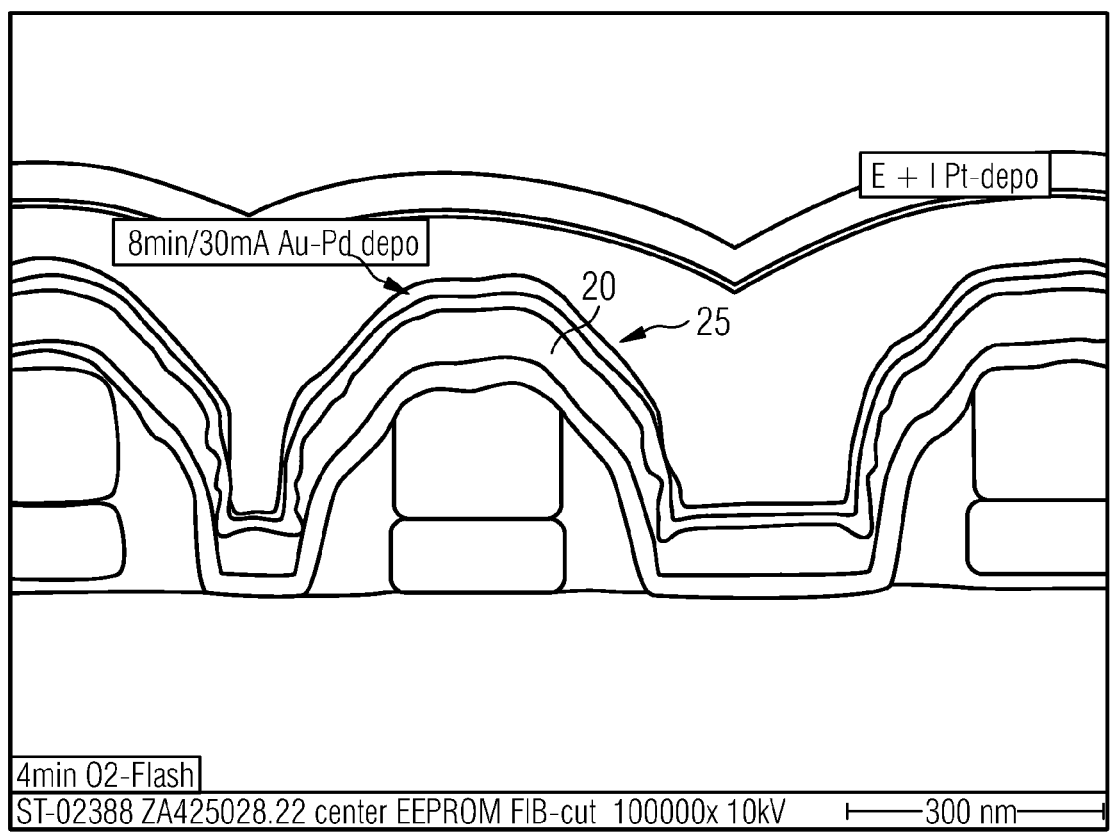
FIGS. 10A-10C show a schematic cross-sectional view of a transistor comprising a carbon sacrificial layer as a protective layer.
Figure 10B:
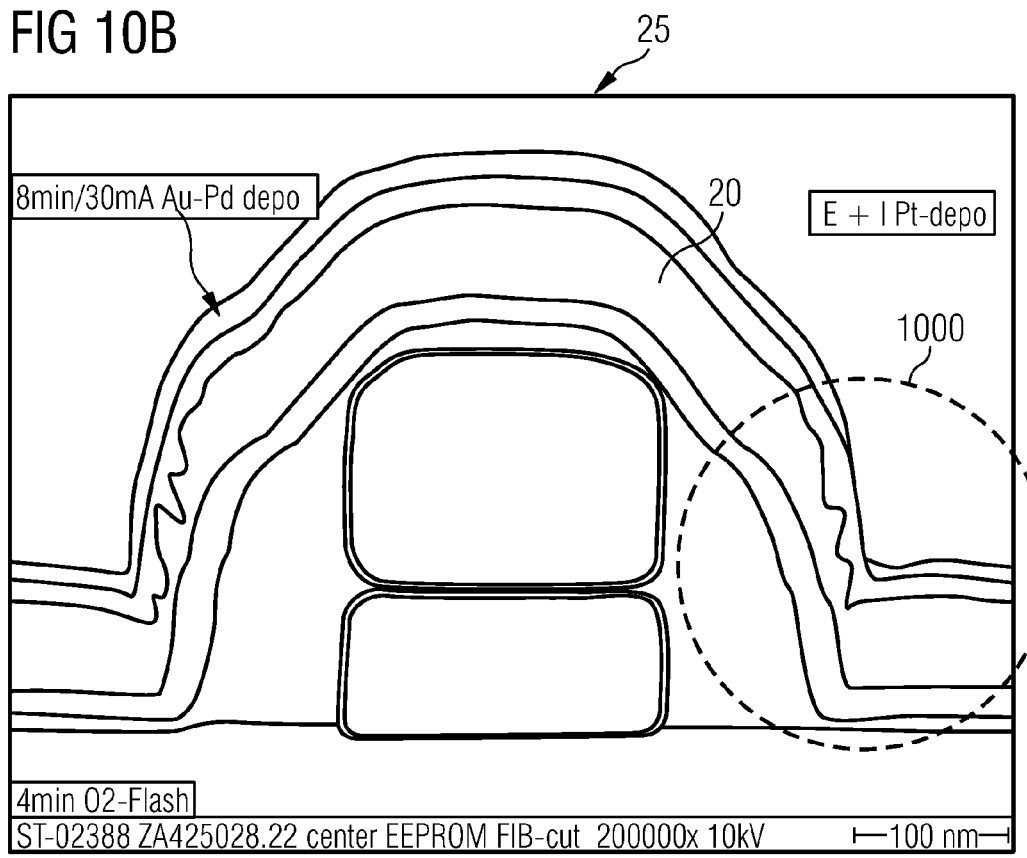
Figure 10C:
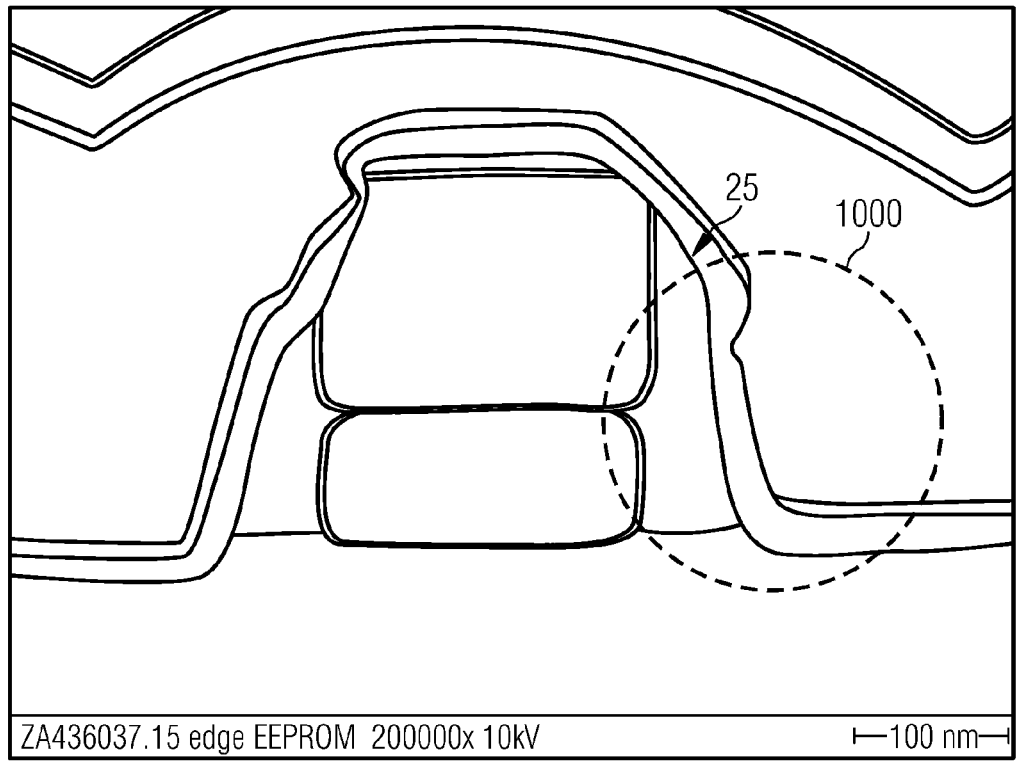

FIGS. 10a to c show a schematic cross-sectional view of a transistor 25 and a covering sacrificial layer 20. The transistor might also be a plurality of transistors, e.g. forming an eProm or another logic device. FIG. 10b shows a section of FIG. 10a focusing on an area 1000, wherein the sacrificial layer 20 is covering the transistor 25 only to a minor extent. FIG. 10c shows the transistor 25 after the middle of line processing steps, showing that in the area 1000, the transistor 25 was harmed by the etching process of the functional layer, since the sacrificial layer did not protect the transistor 25 sufficiently. This phenomenon becomes worse if the sacrificial layer becomes smaller. Nonetheless, the height of the sacrificial layer defines the height of the cavity of a MEMS device in the MEMS area 60, wherein a small height of the cavity results in an improved sensitivity of the MEMS device. Therefore, it is contradictory that it is desired to have a thick sacrificial layer over the transistors in the transistor region and only a small height of the sacrificial layer in the MEMS region to form the cavity period. Therefore, if a small height of the cavity is desired, the embodiment described with respect to FIGS. 11a to l is advantageous.

In other words, the carbon sacrificial layer 20 together with the overlying silicon nitride layer 20' needs to withstand or enable a lithography rework of the silicon lamella 30. Especially thin carbon layers have the drawback that the silicon nitride layer 20', being deposited on top of the carbon layer 20 e.g. using a chemical vapor deposition process, or the carbon layer 20 itself do not cover the at least one transistor 25 properly. This becomes even more significant, the higher and/or steep the at least one transistor is. FIG. 10e shows the at least one transistor 25, which is damaged during the following processing steps (e.g. plasma and/or isotropic etching), especially the (plasma) etching of the silicon lamella 30 (i.e. structuring of the functional layer 30) and the etching of the sacrificial layer 20 in the MEMS region 60. This may damage structures especially in the eProm (or transistor) region 27. Furthermore, the carbon layer needs to be removed reliably, before proceeding with the CMOS processes after the formation of the sensor in the MEMS region 20 is possible. Additionally, since the carbon layer does not withstand wet chemical processes such as wet etching, using wet chemical processes is not possible without damaging the micromechanical system.

Figure 11G:
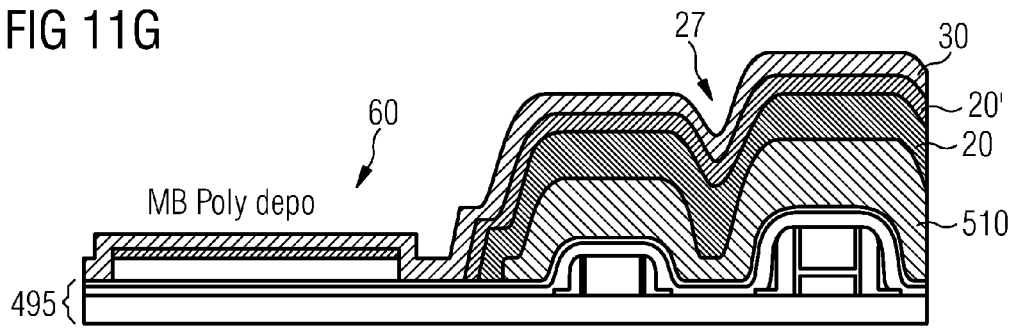
Figure 11H:
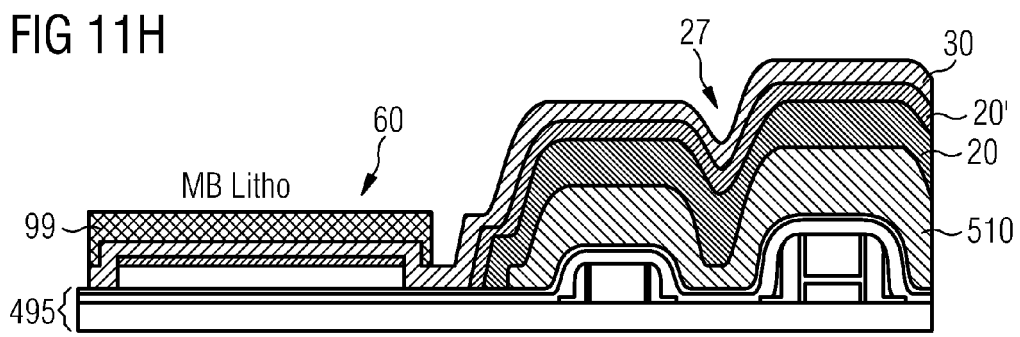

FIGS. 11a-l show a schematic cross-sectional view of a micromechanical system at several stages of a manufacturing process according to an embodiment. FIG. 11a shows a schematic illustration of a semiconductor substrate after the FEOL processes together with a legend 500 indicating different layers used in the further processing steps. In a first step, shown in FIG. 11b, an isolating material 510, e.g. an oxide such as an HDP oxide, is deposited on the semiconductor substrate 495. For the sake of simplicity, FIG. 11 describes the layer 20'', illustrated in FIG. 9, as a part of the processed semiconductor substrate 495. The oxide 510 is advantageously the same oxide 45 which is deposited in a last step of the middle of line process (compare with FIG. 11l) as a basis for the metallization structures in the BEOL process.

In a second step (FIG. 11c) a resist 99 is deposited over the oxide 510 in the transistor region to protect the oxide in the transistor region from being etched (e.g. wet etched). The etching, for example a wet etching process, removes the oxide 510 in the MEMS region 60. From now on, the following processing steps may be the same as described with respect to FIG. 9. The deposition of the carbon sacrificial layer 20 and a layer 20' comprising nitrogen, which may be a hard mask protecting the carbon sacrificial layer during subsequent etching processes is shown in FIG. 11d. A resist 99 is applied on the nitrogen layer 20', shown in FIG. 11e. In an etching process, e.g. plasma etching (c.f. FIG. 11f), the sacrificial layer 20 and the layer 20' remain in the transistor region 27 and in a part of the MEMS region 60, wherein the layers 20 and 20' form the future cavity for the MEMS device. Furthermore, the resist 99 has also been removed in FIG. 11f.

Figure 11I:
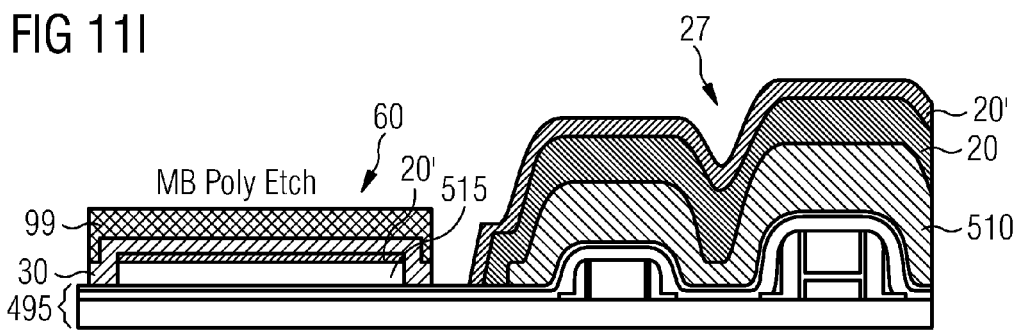
Figure 11J:
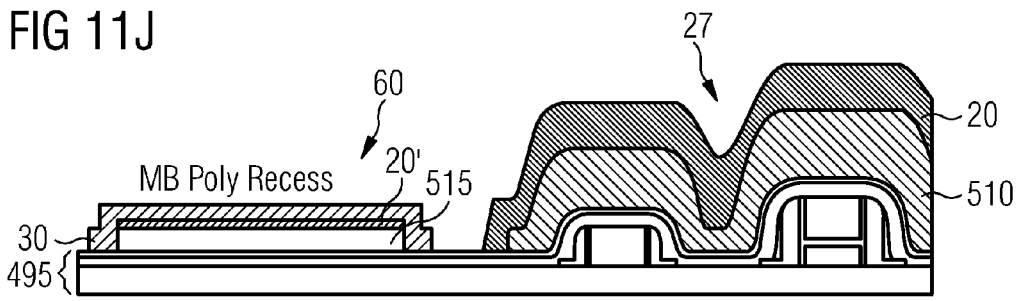
Figure 11K:
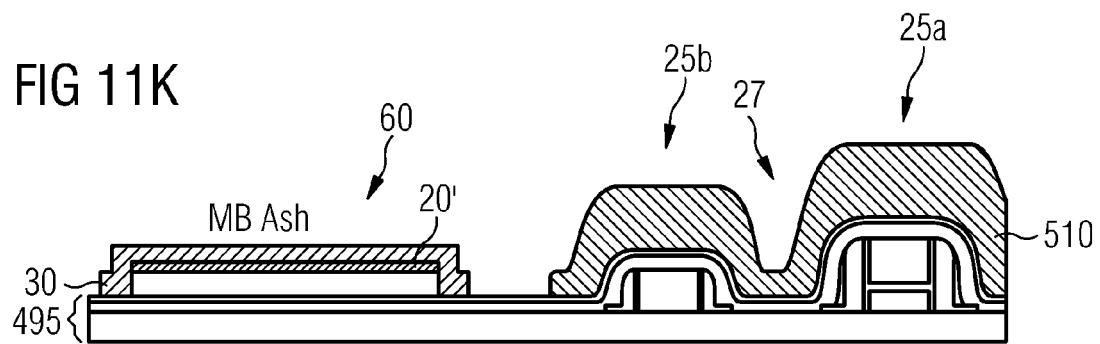
Figure 11L:
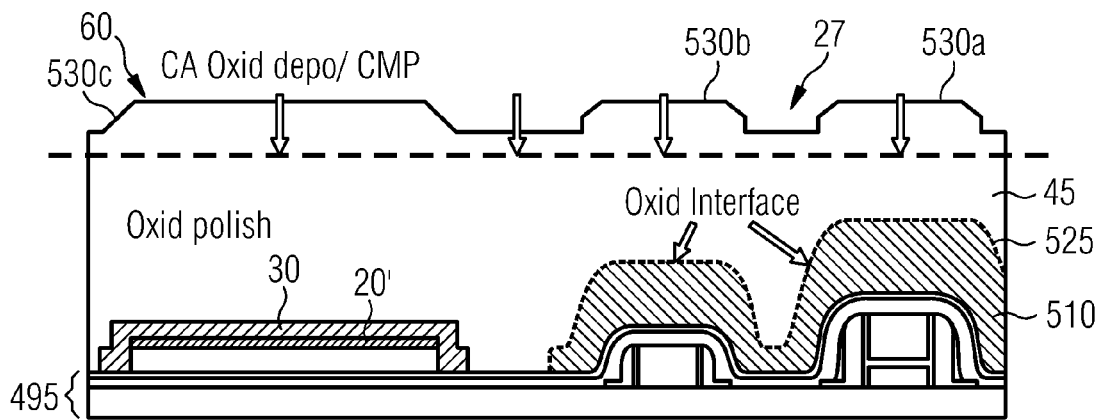

FIG. 11g shows the deposition of the functional layer 30 in the MEMS region 60 and the transistor region 75, wherein in FIG. 11h, the resist 99 is again applied in the MEMS region 60 protecting the functional layer 30 in the MEMS region from being etched (FIG. 11i). FIG. 11j shows the resist 99 being removed. FIG. 11k shows the removal of the sacrificial layer 20, for example an ashing process, where the functional layer 60 remains over a cavity in the MEMS region and the transistors 25a, 25b remain covered by the oxide layer 510 in the transistor region 25. FIG. 11l shows the further layer 45 being deposited on the substrate. Since the oxide layer 510 and the further layer 45 are advantageously from the same material, only a small interface 525 indicates that the oxide layer 510 and the further layer 45 have been deposited during different processing steps. The interface 525 is a characteristic feature of a MEMS element fabricated using the method according to the described embodiment.

The described embodiment replaces or better enlarges the protective layer covering the transistor in the transistor region by depositing a further oxide layer under the, formerly as a protective layer used, carbon sacrificial layer. The oxide layer 510 (protective layer) is independent from the height of the sacrificial layer 20 and, therefore, has no restrictions in its height. Therefore, it is possible to use a sacrificial layer at a small height to build the cavity of the MEMS device and, furthermore, to efficiently protect the transistors in the transistor region using the oxide layer 510. This overcomes the issues shown in FIGS. 10a to c. Moreover, the oxide is more robust against the silicon lamella structuring (silicon plasma etching and following isotropic plasma etching) and more robust against a lithographic rework, which requires further etching processes. This is obvious, since a carbon sacrificial layer may even loose its protective characteristic during a first etching process. Furthermore, the oxide layer resists wet etching processes which would damage the carbon sacrificial layer. Therefore, using the oxide protective layer according to the embodiment, said wet etching processes may be used during the formation of micromechanical systems. Additionally, the oxide layer is a standard cover in CMOS processes. Therefore, a removal of the oxide layer 510 can be omitted which significantly reduces the risk of damaging the transistor 25a, b during a removal of the previously used carbon sacrificial layer. This process is further advantageous, since the whole CMOS integration remains constant, wherein only two steps (depositing and structuring the oxide layer 510) may be added beforehand.

Typical heights of the protective layer 510 are between 100 nm to 2 µm. Additionally, the previously deposited oxide may simplify a final chemical mechanical polishing step since the unevenness 530a and 530b are, compared to the unevenness 530c, on a more even level than without the oxide deposition. This results from a typical height of an upper surface of the functional layer 30 in the MEMS region of 350 nm and a typical height of the transistors in the transistor region of about 250 nm. This has to be taken into consideration when examining FIG. 11 which shows the heights of the functional layer 30 and the at least one transistor 25a,b in an opposite way.

Embodiments show a further method for manufacturing a pressure sensor, the method comprises forming a protective layer comprising an isolating material at a surface of the semiconductor substrate and forming thereon a sacrificial layer. Furthermore, a functional layer covering the sacrificial layer is formed. The method further comprises forming at least one hole and removing the sacrificial layer by applying a removing process through the at least one hole to create a cavity. A thermal treatment at a temperature between 550° C. to 750° C. is provided and the at least one hole is closed. The thermal treatment may provide a restructuring of the atomic structure and an activation of doping atoms of the functional layer and may therefore transforms amorphous silicon to polycrystalline silicon in the functional layer. Said method may be performed between the front end of line (FEOL) and the back end of line (BEOL).

Embodiments further show a method for manufacturing a micromechanical system, the method comprises forming at least one transistor in a transistor region of a substrate and depositing a protective layer comprising an isolating material above the at least one transistor. Furthermore, a structured sacrificial layer is formed in a MEMS region of the substrate and a functional MEMS layer is formed at least partially covering the structured sacrificial layer. In a further step, etch holes in the functional MEMS layer are provided and the sacrificial layer is removed to create a cavity. A further layer is formed to close the etch holes, wherein the further layer extends above at least a portion of the transistor region and at least one metal layer is formed in the transistor and/or the MEMS region. The further layer may be a dielectric layer extending above at least a portion of the transistor region and the at least one metal layer is formed above the dielectric layer. Furthermore, the further layer is at least partially removed in the transistor region.

Figure 12:
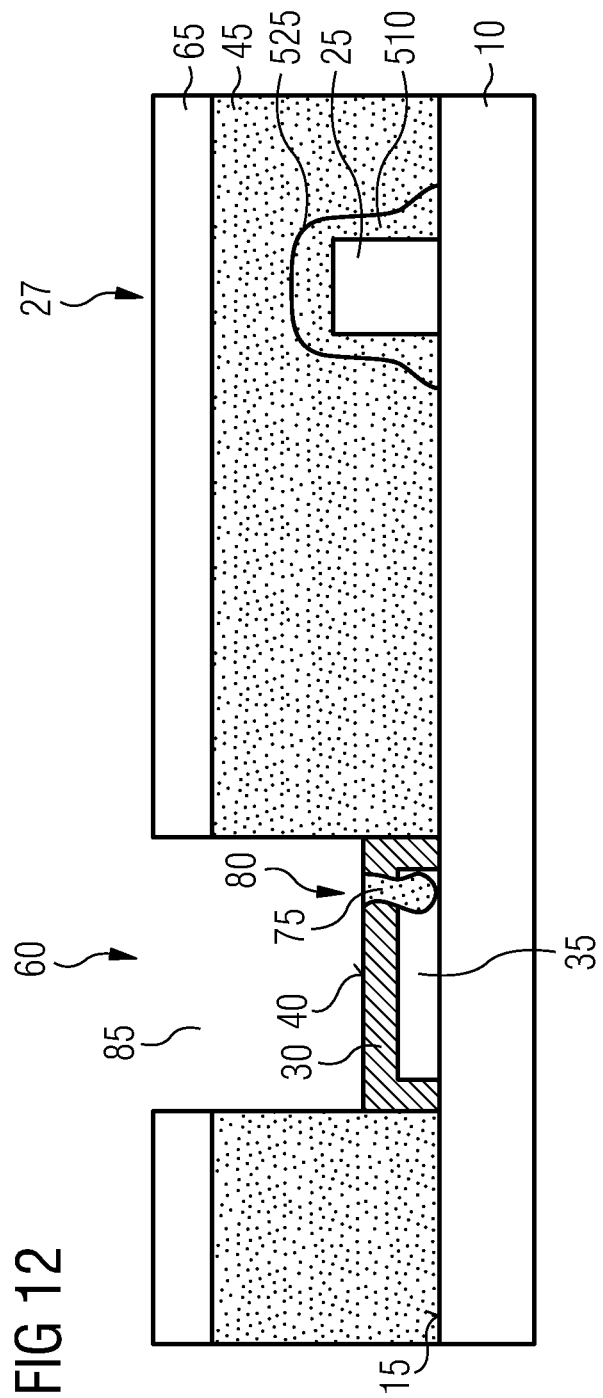
FIG. 12 shows a schematic cross sectional view of a micromechanical system according to an embodiment.

FIG. 12 shows a schematic cross sectional view of a micromechanical system according to an embodiment. The micromechanical system comprises the semiconductor substrate 10, at least one transistor 25 in the transistor region 27, at least one metal layer 65 above the at least one transistor 25, wherein a lower surface of the at least one metal layer has a first vertical level. Furthermore, the micromechanical system comprises the functional MEMS layer 30 in the MEMS region 60, the functional layer having an upper surface at a second vertical level which is lower than the first vertical level and an interface 525 in the transistor region between the at least one transistor 25 and the at least one metal layer 65 above the at least one transistor. The interface 525 indicates that the protective layer 510 and the further layer 45 are deposited in different processing steps and therefore, even though they comprise the same material, a small structural difference can be recognized at the former surface of the protective layer 510 whereon the further layer 45 is deposited.

The functional layer 30 might contain polycrystalline silicon and may further comprise the hole 75 described above. The functional layer may further contains a layer closing the hole, wherein a height of the layer closing the hole is below 600 nm and wherein the layer closing the hole may be an interlevel dielectric (ILD) layer forming (e.g. the further layer 45) which is removed in the MEMS region 60 to expose the functional layer 30. This release etch is typically performed after the at least one metal layer 65 is deposited and the a BEOL process is completed. The at least one dielectric layer 45 may extend in the MEMS region and the transistor region, wherein the at least one metal layer in the transistor region is deposited above the dielectric layer. The cavity 35 is advantageously formed between the functional MEMS layer 30 and the substrate 10. An exemplary arrangement of the substrate 10 is described with respect to FIG. 6.

The previously discussed embodiments allow the efficient implementation of pressure sensors. The singulation of the sensors may be performed by any appropriate technique, such as by cutting, sawing, etching or stealth dicing. In stealth dicing, a laser destroys the crystal-structure in a predetermined depth of the substrate, such that the substrate may be singulated (for example by breaking the substrate) such that the cavities of the substrate can be reliably opened and ventilated.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

In the foregoing Detailed Description, it can be seen that various features are grouped together in embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Furthermore, in some embodiments a single step may include or may be broken into multiple sub steps. Such sub steps may be included and part of the disclosure of this single step unless explicitly excluded.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A method for manufacturing a micromechanical system, the method comprising:
   forming in a Front-End-of-Line (FEOL) process transistors in a transistor region;
   after the FEOL-process, depositing a protective layer in the transistor region, wherein the protective layer comprises an isolating material;
   forming a sacrificial layer after the protective layer is deposited;
   structuring the sacrificial layer to form a structured sacrificial layer;
   forming a functional layer at least partially covering the structured sacrificial layer; and
   removing the sacrificial layer to create a cavity.

2. The method according to claim 1, wherein the isolating material comprises an oxide.

3. The method according to claim 1, wherein the sacrificial layer comprises carbon.

4. The method according to claim 1, wherein a height of the sacrificial layer is smaller than 100 nm or smaller than 75 nm or smaller than 50 nm.

5. The method according to claim 1, wherein the sacrificial layer is completely covered by the functional layer.

6. The method according to claim 1, wherein a hole is created in the functional layer and wherein the sacrificial layer is removed using the hole to apply a removing process in order to create the cavity between the functional layer and the surface of the semiconductor substrate and wherein a layer is disposed at a surface of the functional layer to close the hole, wherein a height of the layer is below 600 nm.

7. The method according to claim 6, wherein the layer comprises a nitride or an oxide.

8. The method according to claim 1, wherein the method further comprises a back end of line (BEOL), wherein at least one metal layer is formed in the BEOL.

9. The method according to claim 8, wherein the at least one metal layer formed in the BEOL is removed at least in a portion of the MEMS region.

10. The method according to claim 9, wherein the removing of the at least one metal layer is concurrent with a structuring of at least one metal line in the transistor region.

11. The method according to claim 10, further comprising:
   after the structuring of the at least one metal line, forming at least one dielectric layer in the transistor region and the MEMS region.

12. A method for manufacturing a micromechanical system, the method comprising:
   forming in a Front-End-of-Line (FEOL) process transistors in a transistor region;

after the FEOL-process, depositing a protective layer in the transistor region, wherein the protective layer comprises an isolating material;

forming a sacrificial layer;

structuring the sacrificial layer to form a structured sacrificial layer;

forming a functional layer at least partially covering the structured sacrificial layer;

removing the sacrificial layer to create a cavity; and performing a thermal treatment, wherein the thermal treatment activates doping atoms of the functional layer and provides a restructuring of the atomic structure of the functional layer.

13. The method according to claim 12, wherein the thermal treatment transforms amorphous silicon to polycrystalline silicon in the functional layer.

14. The method according to claim 12, wherein the thermal treatment provides a tension for the functional layer.

15. The method according to claim 12, wherein the thermal treatment is processed at 550° C. to 750° C.

* * * * *